(12) United States Patent
Dong et al.

(10) Patent No.: US 9,123,425 B2
(45) Date of Patent: Sep. 1, 2015

(54) ADJUSTING CONTROL GATE OVERDRIVE OF SELECT GATE TRANSISTORS DURING PROGRAMMING OF NON-VOLATILE MEMORY

(71) Applicant: SanDisk Technologies Inc., Plano, TX (US)

(72) Inventors: Yingda Dong, San Jose, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 78 days.

(21) Appl. No.: 14/047,381

(22) Filed: Oct. 7, 2013

(65) Prior Publication Data
US 2014/0293701 A1  Oct. 2, 2014

Related U.S. Application Data

(60) Provisional application No. 61/807,716, filed on Apr. 2, 2013.

(51) Int. Cl.
*G11C 16/04* (2006.01)
*G11C 16/12* (2006.01)
(Continued)

(52) U.S. Cl.
CPC ............ *G11C 16/12* (2013.01); *G11C 11/5628* (2013.01); *G11C 16/0475* (2013.01); *G11C 16/0483* (2013.01); *G11C 16/10* (2013.01); *G11C 16/3427* (2013.01); *H01L 27/1157* (2013.01); *H01L 27/11519* (2013.01); *H01L 27/11524* (2013.01); *H01L 27/11556* (2013.01);
(Continued)

(58) Field of Classification Search
CPC .................................................. G11C 16/0483
USPC ..................................................... 365/185.28
See application file for complete search history.

(56) References Cited

U.S. PATENT DOCUMENTS

| 7,433,231 B2 | 10/2008 | Aritome |
| 7,502,261 B2 | 3/2009 | Harari |

(Continued)

FOREIGN PATENT DOCUMENTS

WO  WO01/24268 A1  4/2001

OTHER PUBLICATIONS

Notice of Allowance dated Nov. 7, 2014, U.S. Appl. No. 14/047,764, filed Oct. 7, 2013.

(Continued)

*Primary Examiner* — Son Mai
(74) *Attorney, Agent, or Firm* — Vierra Magen Marcus LLP

(57) ABSTRACT

In a 3D stacked non-volatile memory device, multiple smaller drain-end selected gate (SGD) transistors replace one larger SGD transistor. The SGD transistors have different control gate overdrive voltages so that, during a programming operation, a discontinuous channel potential is created in an inhibited NAND string. The SGD transistor closest to the bit line has a lower control gate overdrive voltage so that the channel potential under it is lower, and the next SGD transistor has a higher control gate overdrive voltage so that the channel potential under it is higher. The different control gate overdrive voltages can be provided by programming different threshold voltages, or by providing different control gates voltages, for the SGD transistors. Undesirable reductions in a Vsgd window due to drain-induced barrier lowering can be avoided.

18 Claims, 19 Drawing Sheets

(51) Int. Cl.

| | |
|---|---|
| *G11C 11/56* | (2006.01) |
| *G11C 16/10* | (2006.01) |
| *G11C 16/34* | (2006.01) |
| *H01L 27/115* | (2006.01) |
| *H01L 29/49* | (2006.01) |

(52) U.S. Cl.
CPC .... *H01L 27/11565* (2013.01); *H01L 27/11582* (2013.01); *H01L 29/4983* (2013.01)

(56) References Cited

U.S. PATENT DOCUMENTS

| | | | |
|---|---|---|---|
| 7,558,141 | B2 | 7/2009 | Katsumata et al. |
| 7,616,490 | B2 | 11/2009 | Mokhlesi et al. |
| 7,649,777 | B2 | 1/2010 | Ichige et al. |
| 7,795,091 | B2 | 9/2010 | Winstead et al. |
| 7,881,114 | B2 | 2/2011 | Park et al. |
| 7,924,622 | B2 | 4/2011 | Lee et al. |
| 8,045,380 | B2 * | 10/2011 | Byeon et al. ............. 365/185.05 |
| 8,254,179 | B2 * | 8/2012 | Lee ........................ 365/185.24 |
| 8,283,228 | B2 | 10/2012 | Alsmeier |
| 8,488,381 | B2 * | 7/2013 | Kim et al. ............... 365/185.17 |
| 8,537,615 | B2 | 9/2013 | Maeda |
| 2007/0210372 | A1 | 9/2007 | Park et al. |
| 2008/0173933 | A1 | 7/2008 | Fukuzumi et al. |
| 2009/0287879 | A1 | 11/2009 | Oh et al. |
| 2010/0195395 | A1 * | 8/2010 | Jeong et al. ............. 365/185.17 |
| 2010/0214839 | A1 | 8/2010 | Guzzi et al. |
| 2011/0057249 | A1 | 3/2011 | Nakao et al. |
| 2011/0199829 | A1 | 8/2011 | Lee et al. |
| 2012/0140562 | A1 | 6/2012 | Choe et al. |

OTHER PUBLICATIONS

U.S. Appl. No. 14/279,411, filed May 16, 2014.
International Search Report & The Written Opinion of the International Searching Authority dated Jul. 21, 2014, International Application No. PCT/US2014/032438.
International Search Report & The Written Opinion of the International Searching Authority dated Aug. 11, 2014, International Application No. PCT/US2014/032439.
Response to Office Action dated Oct. 6, 2014, U.S. Appl. No. 14/047,764, filed Oct. 7, 2013.
U.S. Appl. No. 14/047,764, filed Oct. 7, 2013.
Notice of Allowance dated Jun. 17, 2014, U.S. Appl. No. 14/279,411, filed May 16, 2014.
Non-final Office Action dated Jul. 9, 2014, U.S. Appl. No. 14/047,764, filed Oct. 7, 2013.
Kumar, M. Jagadesh, et al., "Diminished Short Channel Effects in Nanoscale Double-Gate Silicon-On-Insulator Metal-Oxide-Semiconductor Field-Effect-Transistors due to Induced Back-Gate Step Potential," Japanese Journal of Applied Physics, vol. 44, No. 9A, pp. 6508-6509, Sep. 2005.
Polishchuk, Igor, et al., "Dual Work Function Metal Gate CMOS Transistors by Ni-Ti Interdiffusion," IEEE Electron Device Letters, vol. 23, No. 4, pp. 200-202, Apr. 2002.
Ana, Farkhanda, et al., "Gate Workfunction Engineering for Deep Sub-Micron MOSFET's: Motivation, Features and Challenges," IJECT, vol. 2, Issue 4, pp. 29-35, Oct.-Dec. 2011.
Reddy, G. Venkateshwar, et al., "A New Dual-Material Double-Gate (DMDG) Nanoscale SOI MOSFET—Two Dimensional Analytical Modeling and Simulation," IEEE Transactions on Nanotechnology, vol. 4, No. 2, Mar. 2005.
Sano, K., et al., "Workfunction Tuning for Single-Metal Dual-Gate CMOS with Mo and NiSi Electrodes," Research Center for Nanodevices and Systems, Hiroshima University, 2 pages, Jan. 2004.
U.S. Appl. No. 13/484,088, filed May 30, 2012.

* cited by examiner

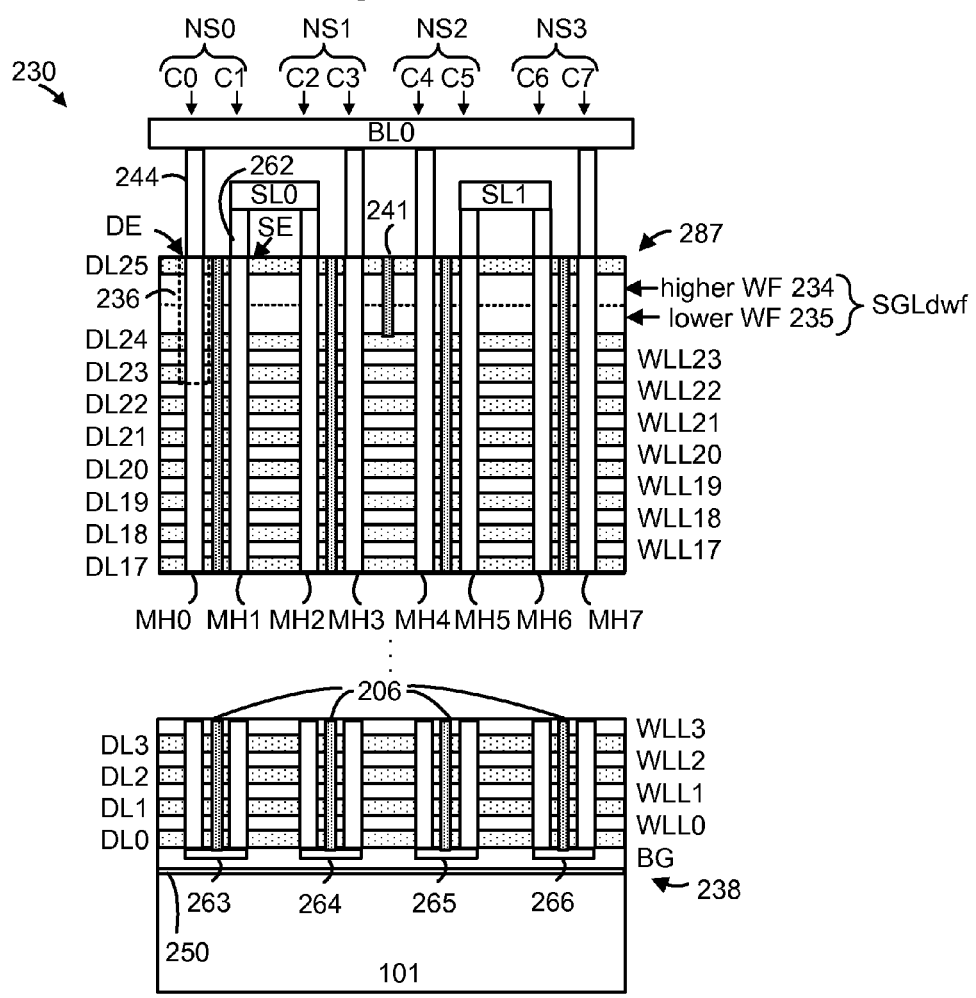
Fig. 2C1
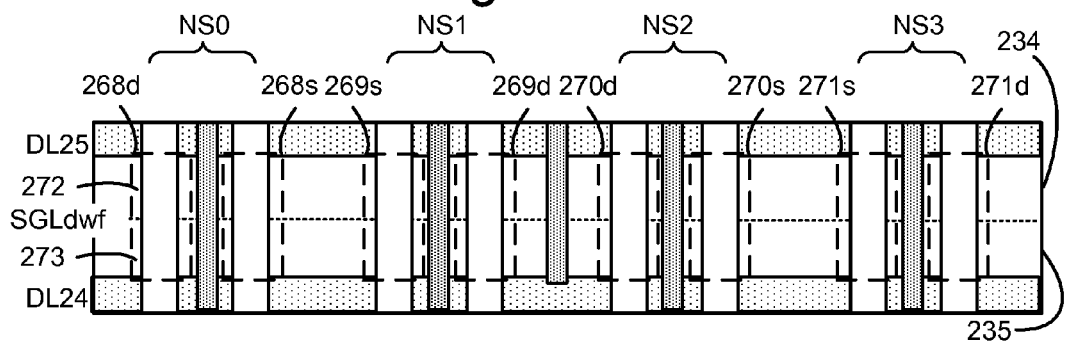
Fig. 2C2

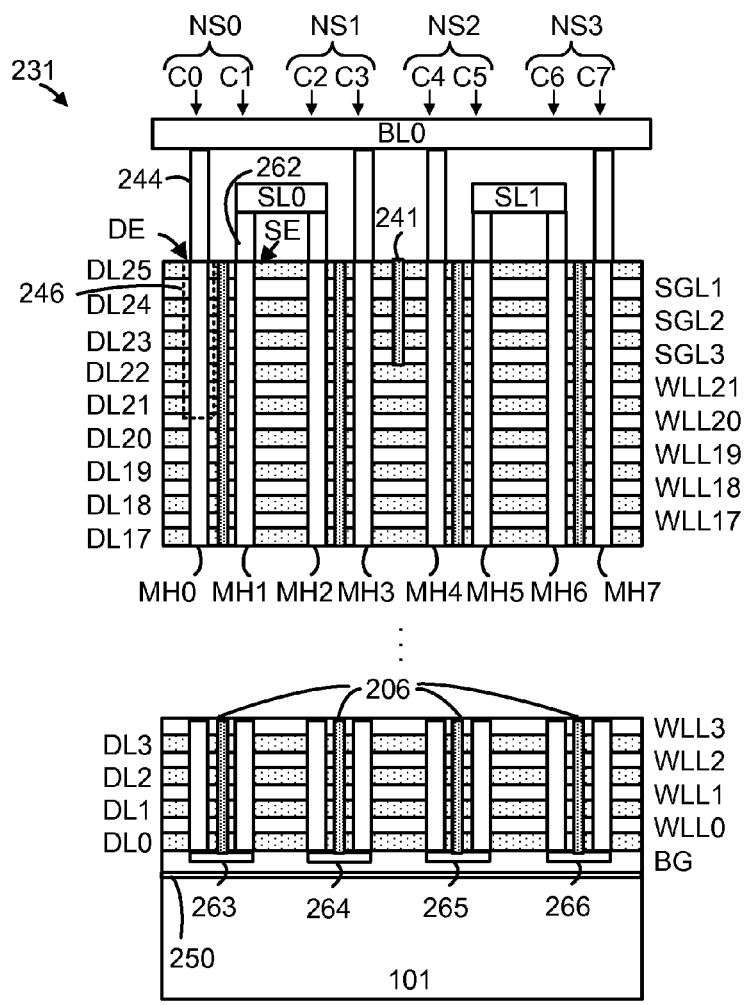
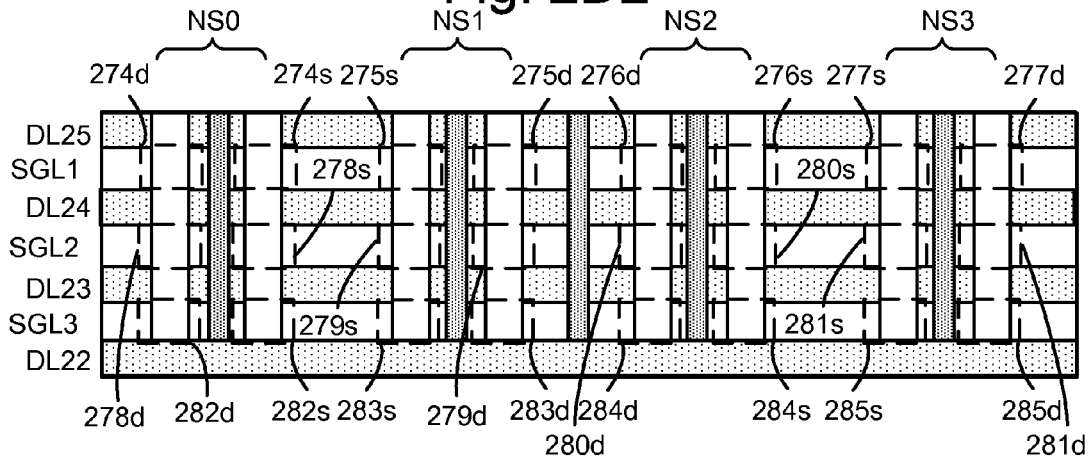

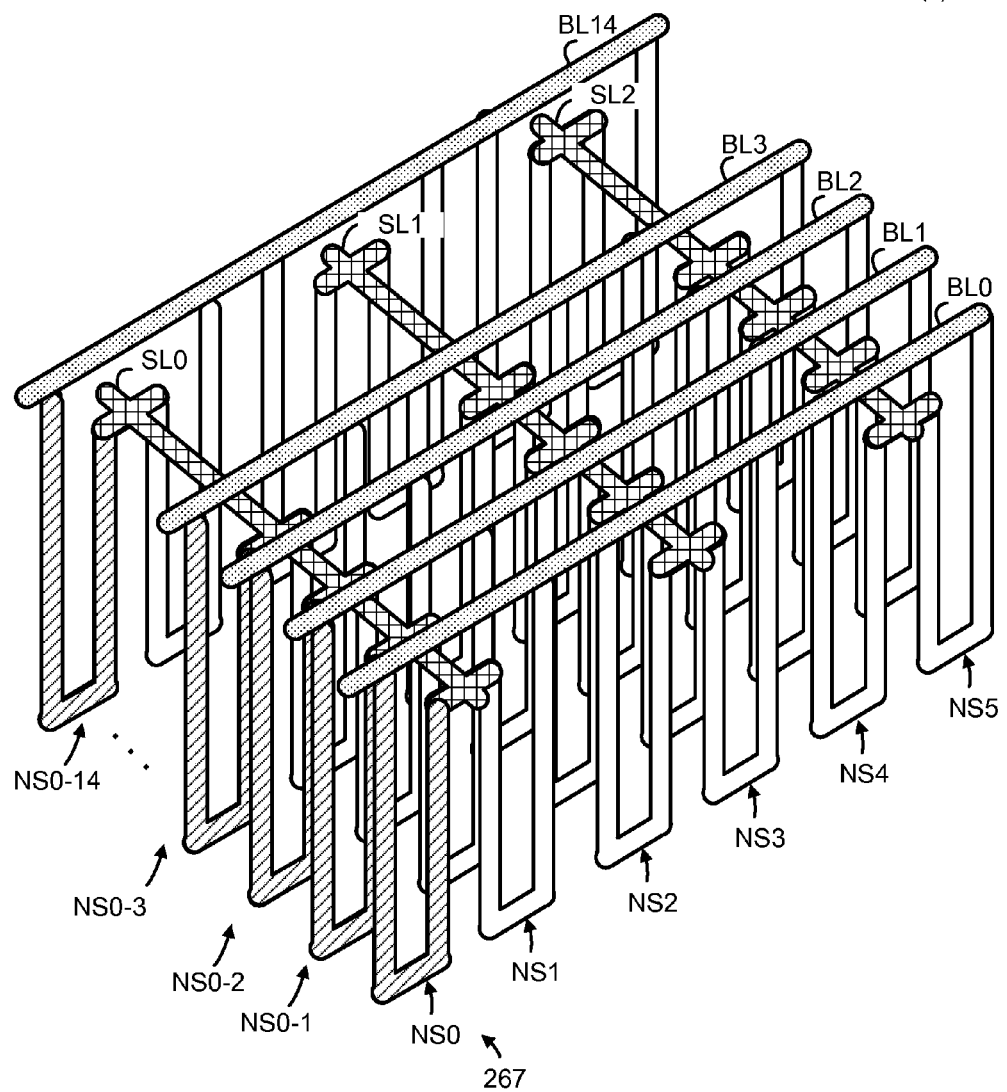
Fig. 2E1

Fig. 2E2
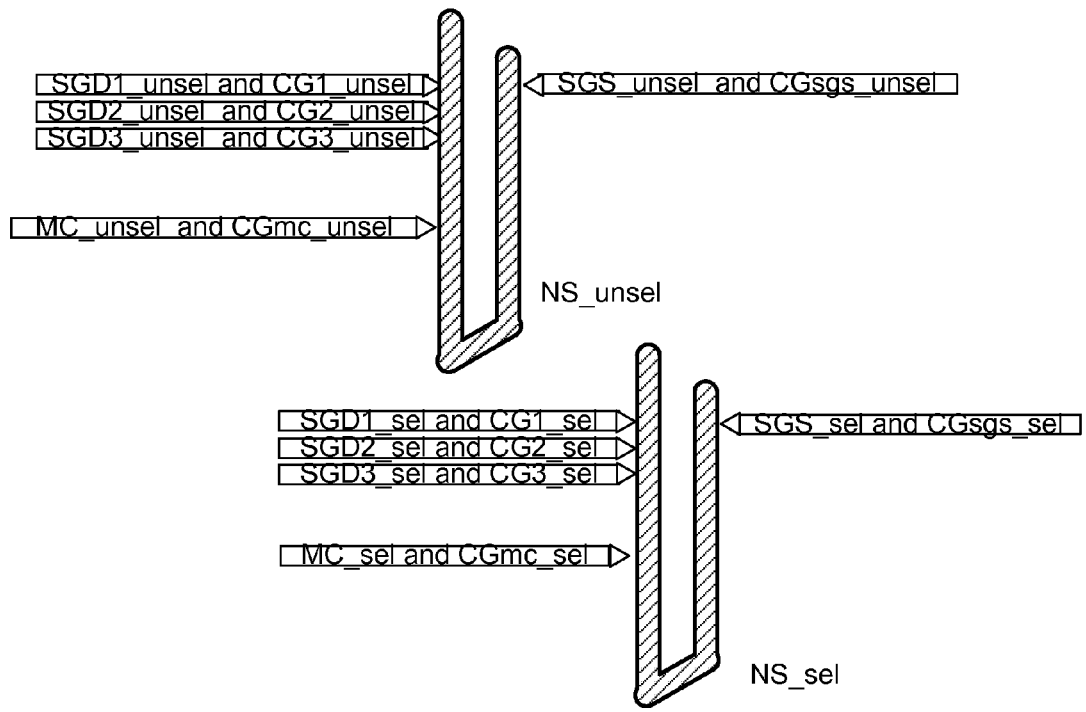
Fig. 3D2
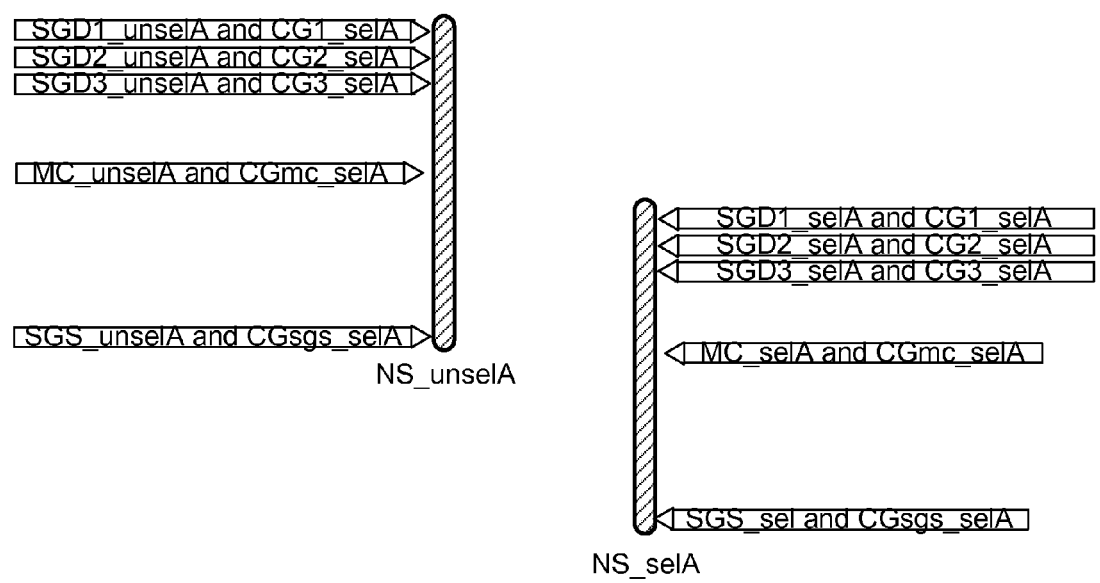

Fig. 3D1
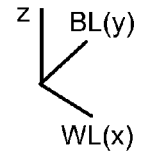
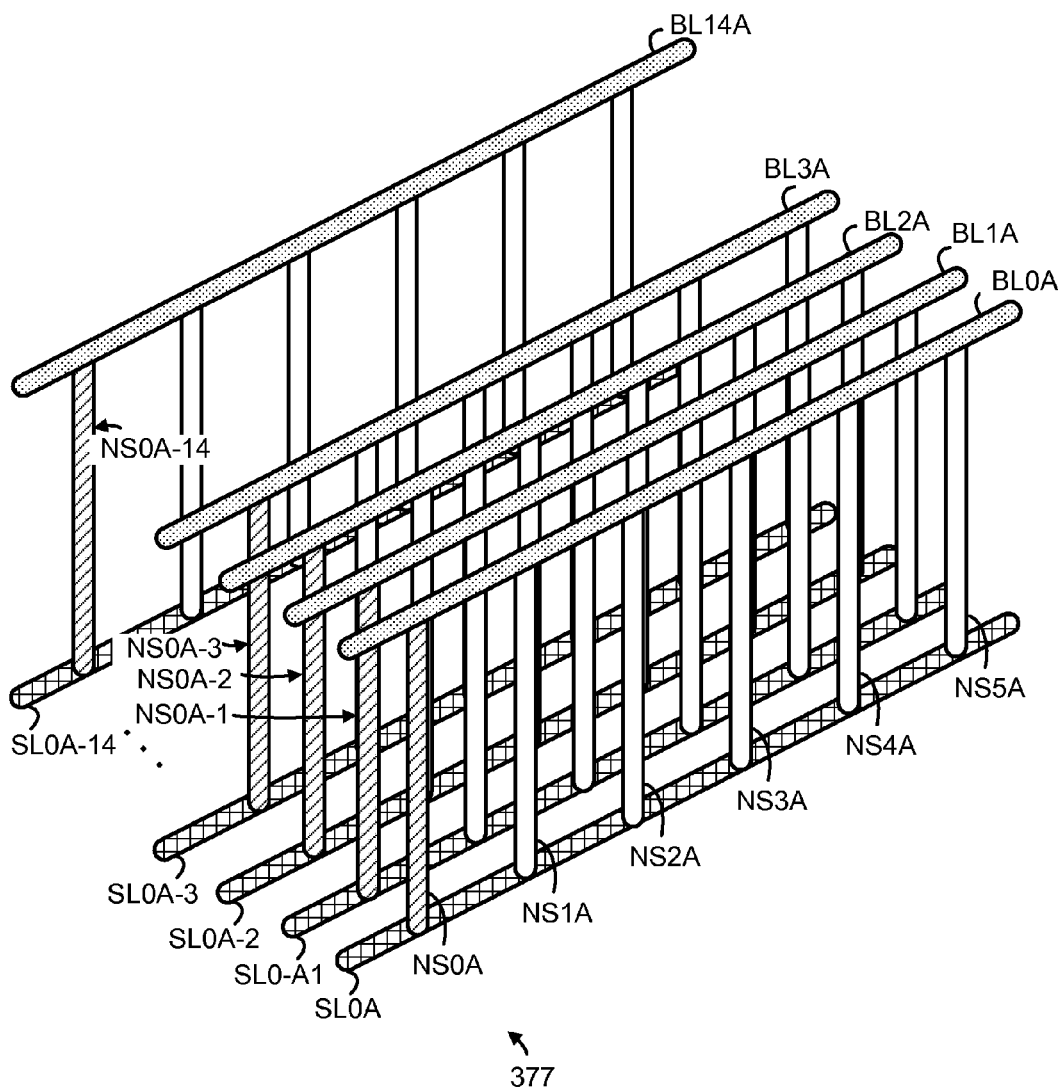

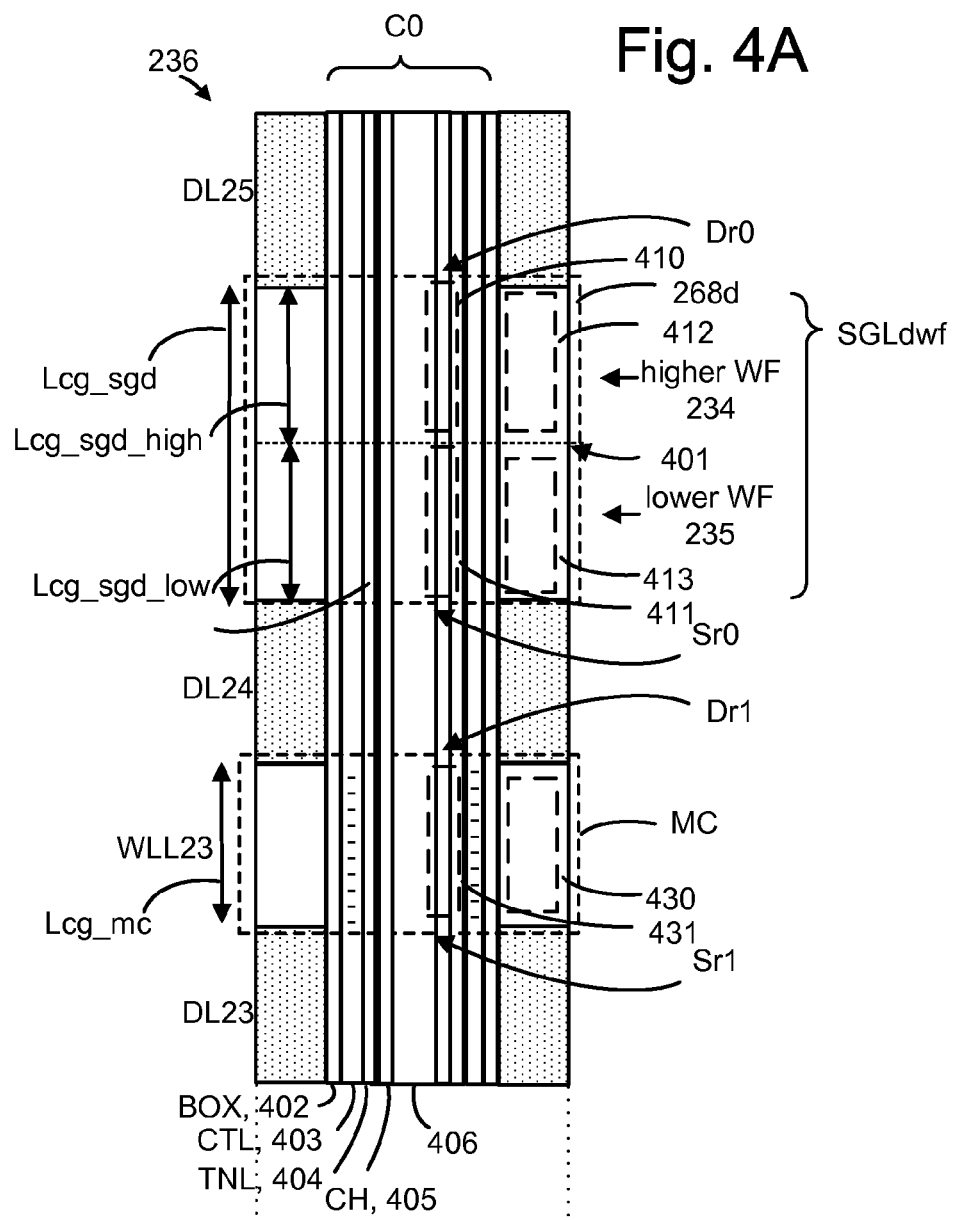
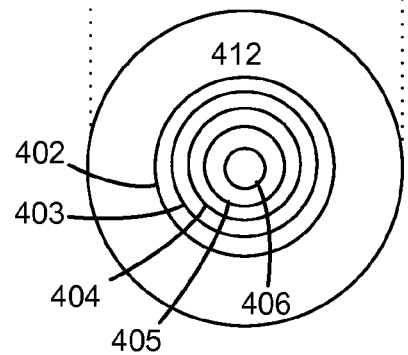

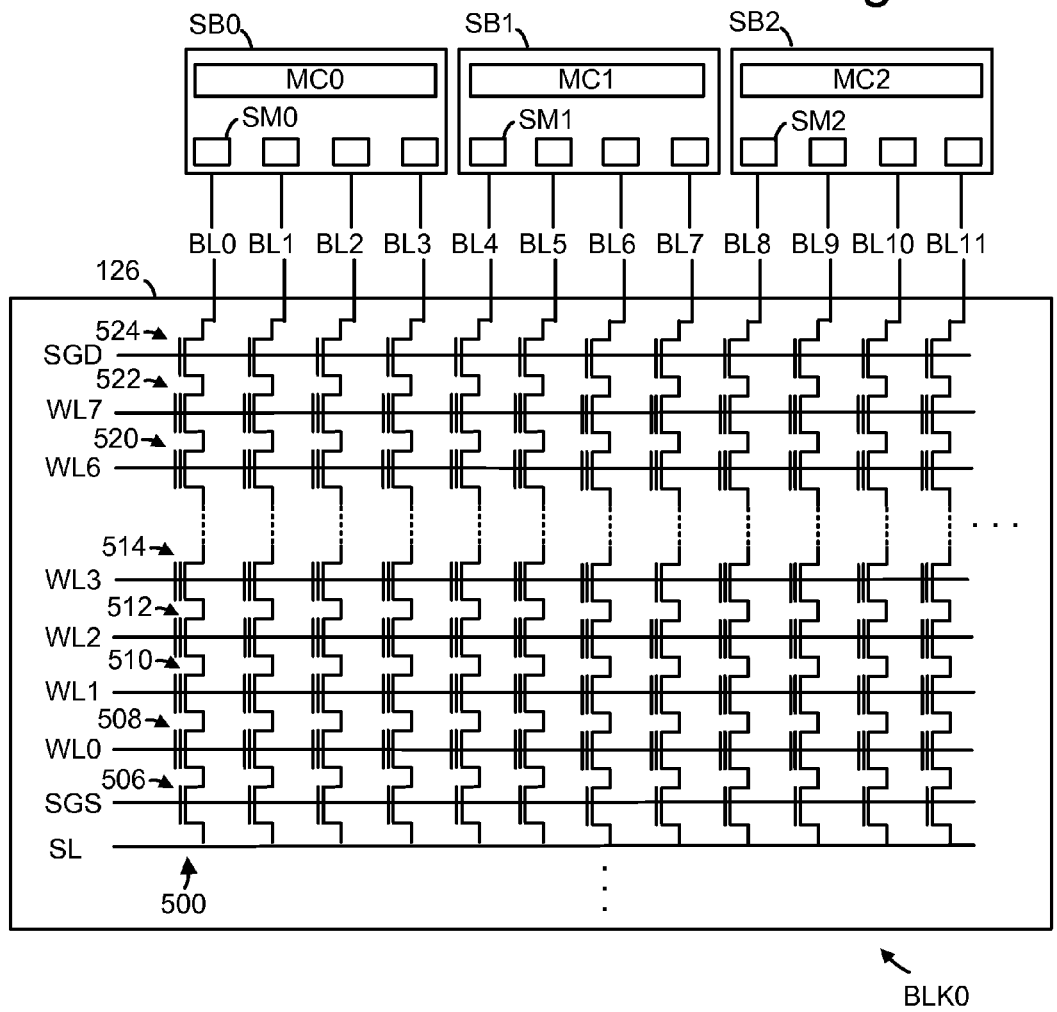
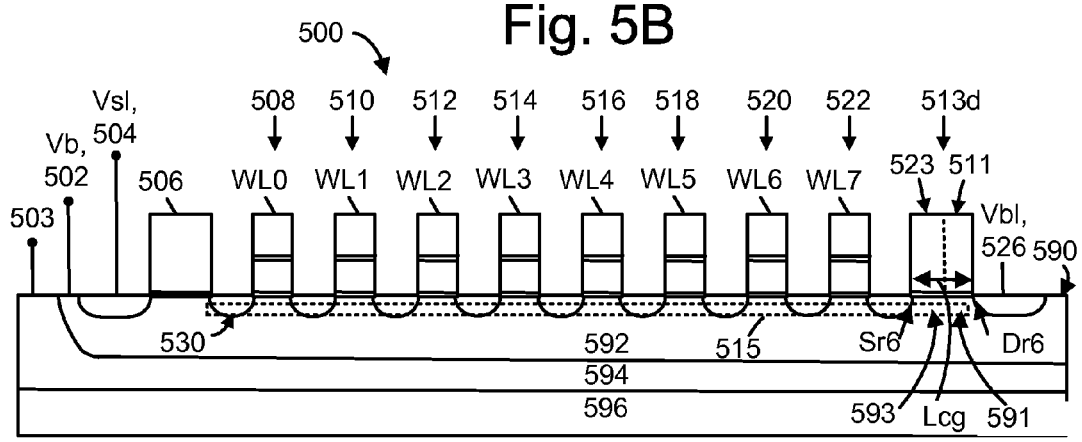

ADJUSTING CONTROL GATE OVERDRIVE OF SELECT GATE TRANSISTORS DURING PROGRAMMING OF NON-VOLATILE MEMORY

CROSS-REFERENCE TO RELATED APPLICATIONS

This is a non-provisional patent application which claims the benefit of U.S. provisional patent application No. 61/807,716, filed Apr. 2, 2013 and incorporated herein by reference.

BACKGROUND OF THE INVENTION

Background

The present technology relates to techniques for programming in a 3D non-volatile memory device and to the construction of such a device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2C1 depicts an embodiment of a stack 230 showing a cross-sectional view of the portion 209 of FIG. 2A, along line 220, where a dual work function select gate layer (SGLdwf) includes a higher work function sublayer 234 above a lower work function sublayer 235.

FIG. 2C2 depicts the select gate transistors formed by the layer SGLdwf of FIG. 2C1.

FIG. 2D1 depicts an embodiment of a stack 231 showing a cross-sectional view of the portion 209 of FIG. 2A, along line 220, where three SGD layers, SGL1, SGL2 and SGL3 are provided.

FIG. 2D2 depicts the select gate transistors formed by the layer SGLdwf of FIG. 2D1.

FIG. 2E1 depicts a block of NAND strings including a set 267 of U-shaped NAND strings consistent with FIG. 2A.

FIG. 2E2 depicts an example selected NAND string and an unselected NAND string of set 267 of FIG. 2E1.

FIG. 3D1 depicts a set 377 of straight NAND strings consistent with FIG. 3C.

FIG. 3D2 depicts an example selected NAND string and an unselected NAND string of set 377 of FIG. 3D1.

FIG. 4A depicts a view of the region 236 of FIG. 2C1 showing a dual work function SGD transistor 268$d$ above a memory cell (MC).

FIG. 4B depicts a cross-section view of the column C0 of FIG. 4A through the higher work function sublayer 234 of the SGD transistor 268$d$.

FIG. 5A depicts a 2D NAND configuration of a block of flash memory cells in the memory array 126 of FIG. 1B and associated sense blocks SB0, SB1, SB2 . . . .

FIG. 5B depicts a cross-sectional view of the NAND string NS0 of FIG. 5A as formed on a substrate, where a dual work function SGD transistor 513$d$ includes control gates portions 511 and 523 with higher and lower work functions, respectively.

DETAILED DESCRIPTION

Figure 1A:
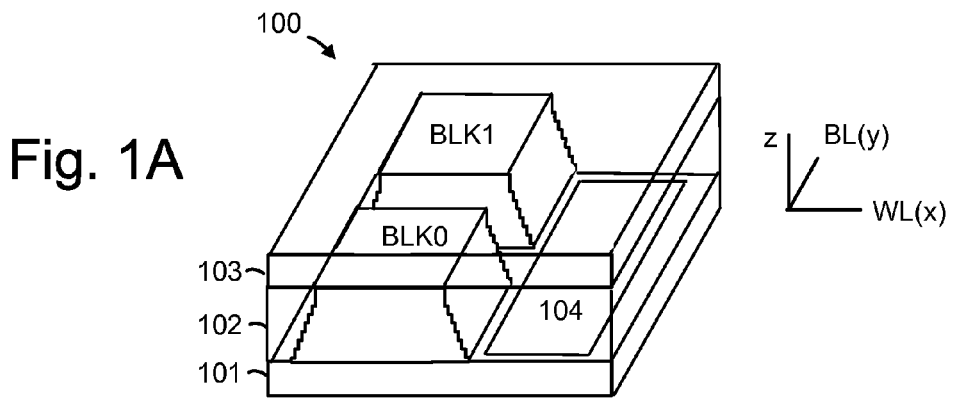
FIG. 1A is a perspective view of a 3D stacked non-volatile memory device.

Techniques are provided for improving the operation of select gate transistors in a memory device such as a 2D or 3D NAND memory device. In particular, the operation of drain-end select gate (SGD) transistors during a programming operation is improved by avoiding or reducing a decrease in a window of acceptable control gate voltages which would otherwise occur. Such a decrease would compromise the ability to program and inhibit the memory cells.

In a NAND string, an SGD transistor is provided between the memory cells and a bit line. In a programming operation, a common Vsgd is provided to the SGD transistors of a set of NAND strings, where the Vsgd has to be within a specified window or range in order for a programming operation to be successful. To program a memory cell in a selected string, the drain end of the string is connected to a bit line voltage Vbl_sel which is grounded (0 V) or set to a relatively low non-zero voltage which allows programming to occur in a slow programming mode (e.g., 0.5-1.0 V). Vsgd should be sufficiently high to make the SGD transistor strongly conductive. If Vsgd is too low, the programming speed can be significantly slowed down.

On the other hand, to inhibit memory cells from being programmed in an unselected string, the SGD transistor is made non-conductive. The drain end of the string is connected to a bit line voltage which is set to a relatively high non-zero voltage Vbl_unsel (>Vbl_sel) such as Vdd=3 V which inhibits programming. Vsgd should be sufficiently low to make the SGD transistor strongly non-conductive. If Vsgd is too high, the memory cells can experience program disturb.

The range of Vsgd between the minimum and maximum acceptable levels is the Vsgd window. However, the Vsgd window is a function of the threshold voltage (Vth) of the SGD transistors, and this Vth can vary due to normal process variations. The Vth of different SGD transistors typically has a distribution about a median value. Moreover, the Vth distribution can vary over time as additional program-erase cycles are experienced by the memory device. To maximize the Vsgd window, the range of the Vth distributions should be a narrow as possible.

If the Vsgd window is too small, it will be difficult to set a suitable bias for the SGD transistors in a set of NAND strings involved in a programming operation, and either program or inhibit operation can be negatively affected. Further, in 3D memory devices such as BiCS flash memory, this Vsgd window is smaller compared with a 2D NAND memory device. One main reason is the lack of body effect for the SGD transistor due to its floating body, which decreases the total Vsgd window by about 1 V. Because of this reduced Vsgd window, using a slow programming mode such as quick pass write, in which a non-zero Vbl is used, may not be possible. As a result, the programming performance of the memory device would be impaired.

In particular, the Vsgd window can be reduced by a change in the Vth of an SGD transistor which is caused by drain-induced barrier lowering (DIBL). DIBL is a short channel effect of a transistor in which the Vth decreases as the drain voltage increases. The DIBL effect for the SGD transistor of an unselected NAND string is greater than the DIBL effect for the SGD transistor of a selected NAND string since Vbl_unsel>Vbl_sel. During program inhibit, the channel potential of the unselected NAND string is high and the SGD transistor can become more difficult to shut off due to DIBL. When DIBL is higher, this problem become more significant.

Techniques provided herein prevent or reduce a decrease in the Vsgd window by providing one or more SGD transistors in a NAND string which have multiple work functions. In one approach, the one or more SGD transistors are constructed with different work function materials in their control gates. The higher work function material is before the lower work function material relative to the bit line or the drain end of the NAND string. This results in a discontinuous channel potential (Vch) for an unselected NAND string which reduces DIBL.

In another approach, the SGD transistors are provided with different control gate overdrive voltages by being programmed to different threshold voltages. In another approach, different the SGD transistors are provided with different control gate overdrive voltages by applying different control gate voltages. The SGD transistor with a lower control gate overdrive voltage is before the SGD transistor with a higher control gate overdrive voltage, relative to a drain end of the NAND string. A lower control gate overdrive voltage results in a lower channel potential.

By using these methods, DIBL as well the Ion/Ioff ratio can be improved for the SGD transistors, resulting in an improvement in the Vsgd window and in the program and inhibit capabilities of the memory device.

A combination of the above approaches can be used as well. Further, the techniques provided herein can be used on both 2D and 3D NAND memory devices.

The following discussion provides details of the construction of a memory device and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
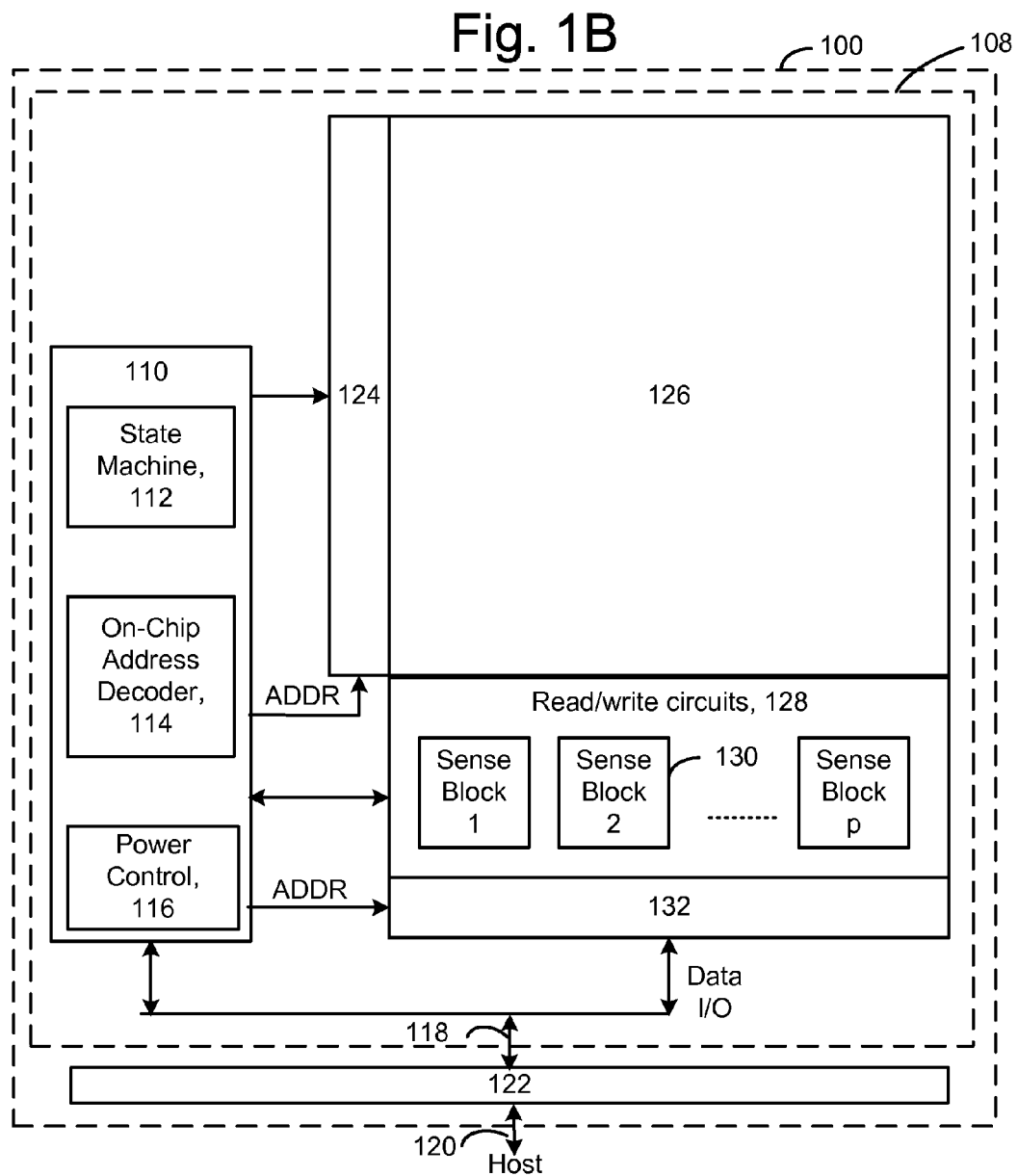
FIG. 1B is a functional block diagram of a memory device such as a 2D memory device (see FIG. 5A) or the 3D stacked non-volatile memory device 100 of FIG. 1A.

FIG. 1B is a functional block diagram of a memory device such as a 2D memory device (see FIG. 5A) or the 3D stacked non-volatile memory device 100 of FIG. 1A. The memory device 100 may include one or more memory die 108. The memory die 108 includes a memory array 126 of memory cells, control circuitry 110, and read/write circuits 128. In a 3D configuration, the memory array can include the blocks BLK0 and BLK1 of FIG. 1A. In a 2D configuration, the memory array can include the block BLK0 of FIG. 5A. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word lines in a 2D configuration, word line layers (WLLs) in a 3D configuration, SGS and SGD transistors and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Figure 2A:
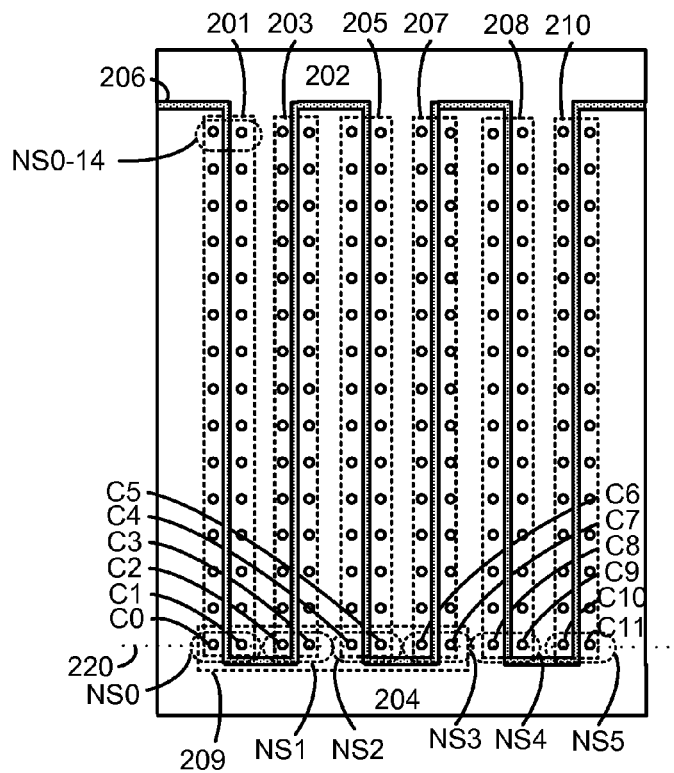
FIG. 2A depicts a top view of example word line layers 202 and 204 in a U-shaped NAND embodiment, as an example implementation of BLK0 in FIG. 1A.
Figure 2A:
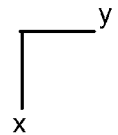

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers.

The view is of a representative layer among the multiple WLLs in a stack. Referring also to FIGS. 2C1 and 2D1, the stack includes alternating dielectric and conductive layers. The dielectric layers include DL0 to DL25 and may be made of SiO2, for instance. The conductive layers include a back gate layer (BGL), word line layers WLL0 to WLL23 and layer SGLdwf in FIG. 2C1, or WLL0 to WLL21 and SGL1-SGL3 in FIG. 2D1. The word line layers are conductive paths to control gates of the memory cells at the layer. Further, FIG. 2C1 includes a dual-work function select gate layer (SGLdwf) which is a conductive path to control gates of select gate transistors of the NAND strings. In this example, SGLdwf comprises a sublayer 234 or portion which has a higher work function and a sublayer 235 or portion which has a lower work function (lower than the higher work function). The sublayers can contact each other, in one approach.

The sublayer 234 provides a first control gate material which has a relatively higher work function and the sublayer 235 provides a second control gate material which has a relatively lower work function, where the first control gate material is before the second control gate material relative to the drain end (DE) of each NAND string. Further, the first and second control gate materials are provided by adjacent first and second sublayers, 234 and 235, respectively, of a respective conductive layer (SGLdwf) of the conductive layers in the stack.

The word line layers of FIG. 2A may represent any one of the word line layers in FIG. 2C1 or 2D1. These conductive layers may include doped polysilicon or metal silicide, for instance. An example voltage of 5-10 V may be applied to the back gate to maintain a conductive state which connects the drain- and source-side columns.

For each block, each conductive layer is divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

A portion 209 of the block is depicted in further detail in connection with FIG. 2C1 or 2D1. Example NAND strings in the portion are represented by NS0-NS3.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set.

Figure 2B:
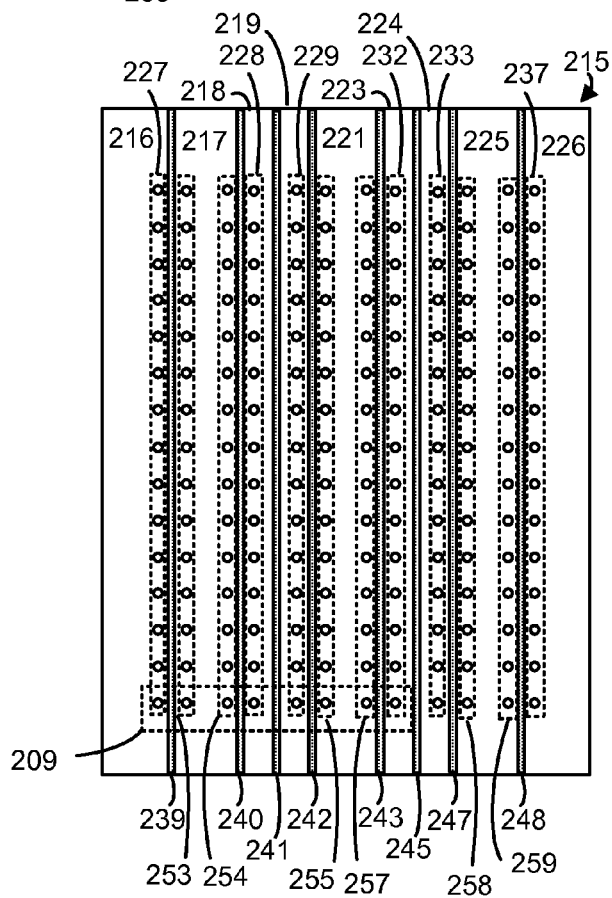
FIG. 2B depicts a top view of example select gate layer portions, consistent with FIG. 2A.
Figure 2B:
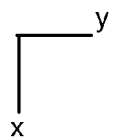

FIG. 2B depicts a top view of example select gate layer portions, consistent with FIG. 2A. In one approach, the select gate layer 215 is different than a WLL in that a separate SGD layer portion, is provided for each set of NAND strings. That is, each single row of SGD transistors extending in the x direction is separately controlled. In other words, the control gates of the SGD transistors in each set of NAND strings are commonly controlled.

Further, an SGS layer portion is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIGS. 2C1 and 2D1. Regions 227, 228, 229, 232, 233 and 237 represent SGD transistors in SGD layer portions 216, 218, 219, 223, 224 and 226, respectively. Regions 253 and 254, 255 and 257, 258 and 259 represent SGS transistors in SGS layer portions 217, 221 and 225, respectively. Regions 255 and 257, 258 and 259, represent SGS transistors in SGS layer portions 221 and 225, respectively. The region 209 from FIG. 2A is repeated for reference.

The select gate transistors are associated with NAND strings NS0-NS5.

FIG. 2C1 depicts an embodiment of a stack 230 showing a cross-sectional view of the portion 209 of FIG. 2A, along line 220, where a dual work function select gate layer (SGLdwf) includes a higher work function sublayer 234 above a lower work function sublayer 235. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263, 264, 265 and 266 which connect the columns. The back gate thus connects the two columns of each U-shaped NAND string. For example, NAND string NS0 includes columns C0 and C1 and connecting portion 263, and has a drain end DE and a source end SE. Conductive vias 244 and 262 connect the DE to a bit line BL0, and the SE to a source line SL0, respectively. NS1 includes columns C2 and C3 and connecting portion 264. NS2 includes columns C4 and C5 and connecting portion 265. NS3 includes columns C6 and C7 and connecting portion 266.

The columns are formed in memory holes MH0-MH7. The memory holes are columnar and extend at least from a top 287 to a bottom 238 of the stack.

The source line SL0 is connected to the source ends of two adjacent memory strings NS0 and NS1. SL0 is also connected to other sets of memory strings which are behind NS0 and NS1 in the x direction. Additional NAND strings in the stack 230 extend behind the NAND strings depicted in the cross-section, e.g., along the x-axis.

The slit 206 from FIG. 2A extends down to DL24.

In the cross-section, multiple portions of the slit are seen, where each portion of the slit is between the drain- and source-side columns of a U-shaped NAND string. The slit 241 from FIG. 2B is also depicted.

Word line layers, e.g., WLL0-WLL23, and dielectric layers, e.g., DL0-DL25, extend alternatingly in the stack. The SGLdwf layer is between D24 and D25.

A region 236 of the stack is shown in greater detail in FIG. 4A.

An advantage of this approach is that a dielectric layer is eliminated so that the stack is reduced in size, compared an approach in which separate SGD transistors are provided.

In FIG. 2C1, a NAND string has one SGD transistor with a relatively long channel length which is the height of the layer SGLdwf. Further, the channel has two portions with different work functions. Thus, one portion of the channel length has a high work function and another portion has a low work function. The SGS transistors have a similar constructions as the SGD transistors in this example, although the operation of the SGS transistor is less critical than the operation of the SGD transistors.

FIG. 2C2 depicts the select gate transistors formed by the layer SGLdwf of FIG. 2C1. The layer includes SGD transistors 268d, 269d, 270d and 271d, and SGS transistors 268s, 269s, 270s and 271s. Each transistor therefore has higher and lower work function portions. For example, SGD transistor 268d has a higher work function portion 272 and a lower work function portion 273. The transistors are associated with the NAND strings as indicated.

FIG. 2D1 depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate SGD transistors are formed in each NAND string.

Figure 4C:
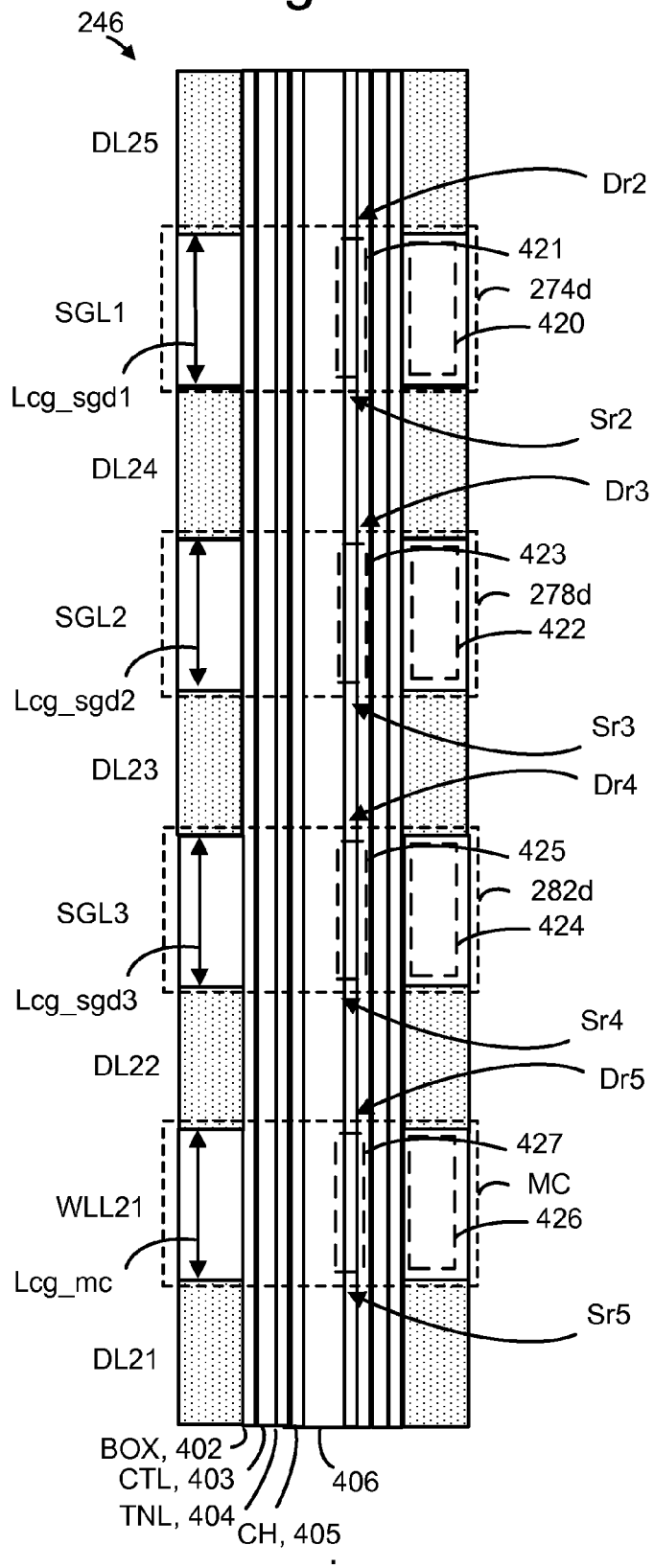
FIG. 4C depicts a view of the region 246 of FIG. 2D1 showing the SGD transistors 274$d$, 278$d$ and 282$d$ above a memory cell (MC).

A region 246 of the stack is shown in greater detail in FIG. 4C.

In FIG. 2D1, a NAND string has three SGD transistors, where each SGD transistor has a relatively short channel length. The channel length is the height of the layers SGL1, SGL2 or SGL3. The SGS transistors have a similar construction as the SGD transistors.

FIG. 2D2 depicts the select gate transistors formed by the layer SGLdwf of FIG. 2D1. SGL1 includes SGD transistors 274d, 275d, 276d and 277d, and SGS transistors 274s, 275s, 276s and 277s. SGL2 includes SGD transistors 278d, 279d, 280d and 281d, and SGS transistors 278s, 279s, 280s and 281s. SGL3 includes SGD transistors 282d, 283d, 284d and 285d, and SGS transistors 282s, 283s, 284s and 285s. The transistors are associated with the NAND strings as indicated. Thus, the drain-end select gate transistors comprise a first drain-end select gate transistor (e.g., 274d, 275d, 276d and 277d) comprising a first control gate material (e.g., a higher work function material) provided by a respective conductive layer (SGL1) of the conductive layers in the stack, and a second drain-end select gate transistor (e.g., 278d, 279d, 280d and 281d) comprising the second control gate material (e.g., a lower work function material) provided by a respective conductive layer (SGL2) of the conductive layers in the stack. Further, the dielectric layers in the stack comprise a dielectric layer (DL24) between the respective conductive layers of the first and second drain-end select gate transistors.

Further, a third drain-end select gate transistor (e.g., 282d, 283d, 284d and 285d) can be provided which is between the plurality of memory cells and the second drain-end select gate transistor, and which has a work function which is less than or equal to the relatively lower work function of the second drain-end select gate transistor. A control gate of the third drain-end select gate transistor is provided by a respective conductive layer (e.g., SGL3) of the conductive layers in the stack, and the dielectric layers in the stack comprise a dielectric layer (e.g., DL23) between the respective conductive layers of the second and third drain-end select gate transistors.

FIG. 2E1 depicts a block of NAND strings including a set 267 of U-shaped NAND strings consistent with FIG. 2A. The set includes NS0, NS0-1, NS0-2, NS0-3, ..., NS0-14 associated with a source line SL0. These NAND strings are shown by a line pattern. Each NAND string in the set is connected to a different bit line such as BL0, BL1, BL2, BL3, ..., BL14. In one approach, a programming operation for a block involves a selected set of NAND strings. Additional NAND strings connected to BL0 include NS1-NS5. Additional source lines include SL1 and SL2.

FIG. 2E2 depicts an example selected NAND string (NS_sel) and an unselected NAND string (NS_unsel) of set 267 of FIG. 2E1. During a programming operation, one or more of the NAND strings can be selected, and one or more can be unselected. NS_sel includes example SGD transistors SGD1_sel, SGD2_sel and SGD3_sel comprising control gates CG1_sel, CG2_sel and CG3_sel, respectively, an example selected memory cell MC_sel comprising a control gate CGmc_sel, and an example SGS transistor SGS_sel comprising a control gate CGsgs_sel. Similarly, NS_unsel includes example SGD transistors SGD1_unsel, SGD2_unsel and SGD3_unsel comprising control gates CG1_unsel, CG2_unsel and CG3_unsel, respectively, an example unselected memory cell MC_unsel comprising a control gate CGmc_unsel, and an example SGS transistor SGS_unsel comprising a control gate CGsgs_unsel. Control gates can be connected between SGD1_sel and SGD1_unsel, SGD2_sel and SGD2_unsel, SGD3_sel and SGD3_unsel, SGS_sel and SGS_unsel, and MC_sel and MC_unsel.

Figure 3A:
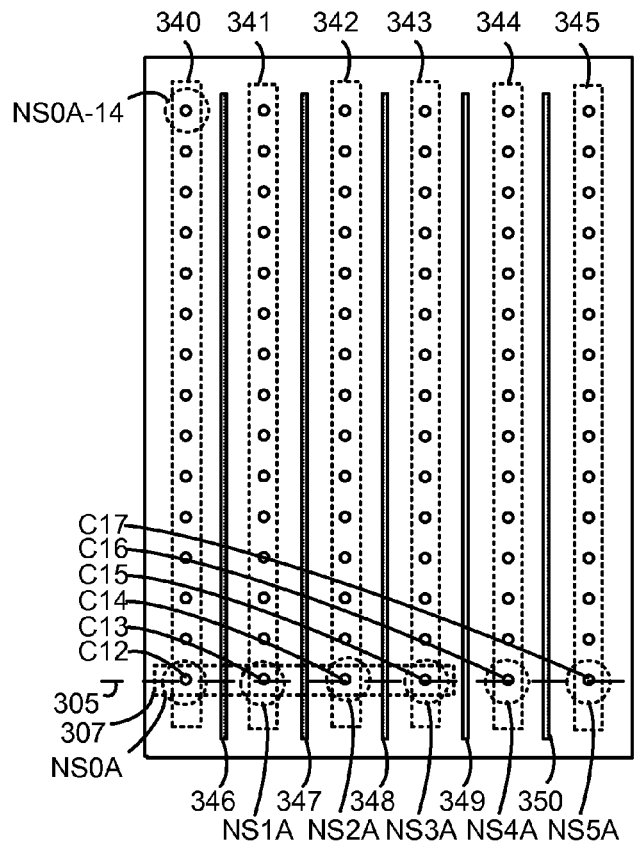
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, ..., NS0A-14. Additional NAND strings include NS1A, NS2A, NS3A, NS4A and NS5A.

Alternatively, the layer 304 represents an SGS layer, in which case each circle represents an SGS transistor.

Figure 3B:
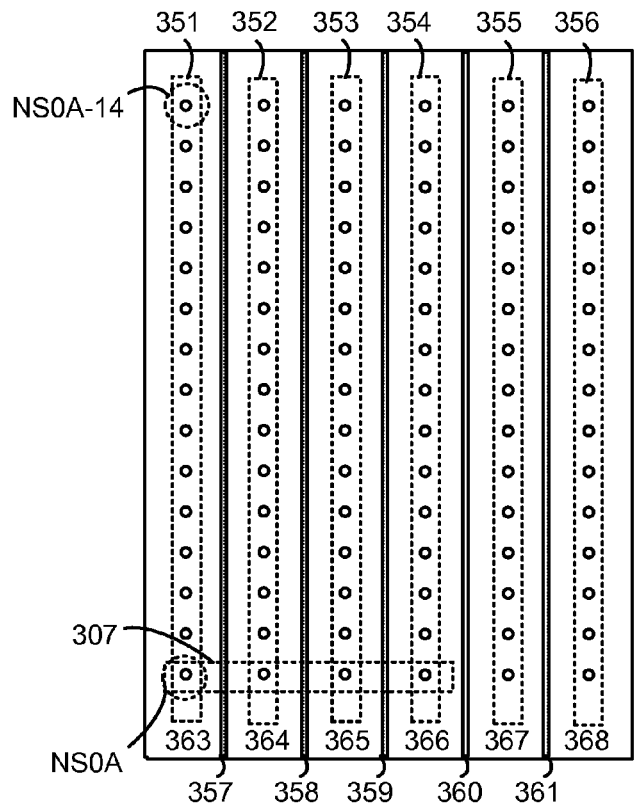
FIG. 3B depicts a top view of an example SGD layer 362, consistent with FIG. 3A.
Figure 3C:
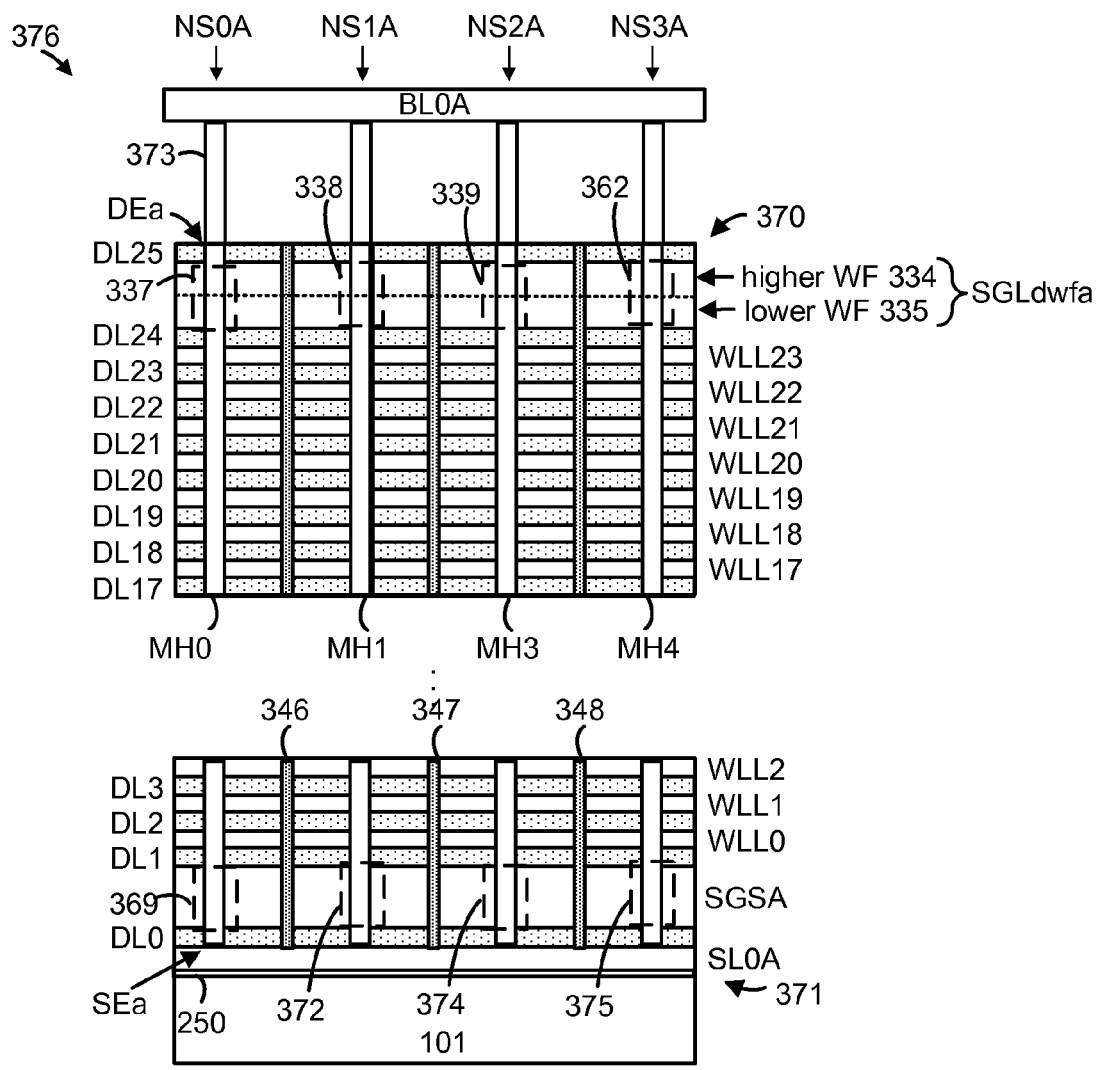
FIG. 3C depicts an embodiment of a stack 376 showing a cross-sectional view of the portion 307 of FIG. 3A, along line 305, where a dual work function SGD layer (SGLdwfa) includes a higher work function sublayer 334 above a lower work function sublayer 335.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated.

The select gate transistors are associated with NAND strings NS0A-NS5A.

FIG. 3C depicts an embodiment of a stack 376 showing a cross-sectional view of the portion 307 of FIG. 3A, along line 305, where a dual work function SGD layer (SGLdwfa) includes a higher work function sublayer 334 above a lower work function sublayer 335. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, extend alternatingly in the stack. The SGLdwfa layer is between D24 and D25. SGD transistors 337, 338, 339 and 362 are formed in the SGLdwfa layer. SGS transistors 369, 372, 374 and 375 are formed in the SGSA layer.

FIG. 3D1 depicts a block of NAND strings including a set 377 of straight NAND strings consistent with FIG. 3C. The set 377 includes NS0A, NS0A-1, NS0A-2, NS0A-3, ..., NS0A-14. These NAND strings are shown by a line pattern. Each NAND string in the set is connected to a different bit line such as BL0A, BL1A, BL2A, BL3A, ..., BL14A and to a different source line such as SL0A, SL0A-1, SL0A-2, SL0A-3, ..., SL0A-14. In one approach, a programming operation for a block involves one set of NAND strings at a time. Additional NAND strings include NS1A-NS5A.

FIG. 3D2 depicts an example selected NAND string and an unselected NAND string of set 377 of FIG. 3D1. This figures has been presented on the same page as FIG. 2E2. NS_selA includes example SGD transistors SGD1_selA, SGD2_selA and SGD3_selA comprising control gates CG1_selA, CG2_selA and CG3_selA, respectively, an example selected memory cell MC_selA comprising a control gate CGmc_selA, and an example SGS transistor SGS_selA comprising a control gate CGsgs_selA. Similarly, NS_unselA includes example SGD transistors SGD1_unselA, SGD2_unselA and SGD3_unselA comprising control gates CG1_unselA, CG2_unselA and CG3_unselA, respectively, an example unselected memory cell MC_unselA comprising a control gate CGmc_unselA, and an example SGS transistor SGS_unselA comprising a control gate CGsgs_unselA. Control gates can be connected between SGD1_selA and SGD1_unselA, SGD2_selA and SGD2_unselA, SGD3_selA and SGD3_unselA, SGS_selA and SGS_unselA, and MC_selA and MC_unselA.

FIG. 4A depicts a view of the region 236 of FIG. 2C1 showing a dual work function SGD transistor 268d above a memory cell (MC). The SGD transistor 268d has a drain side Dr0 facing the bit line, and a source side Sr0 on the other side. The SGD transistor include a higher work function control gate material 412 as part of the sublayer 234 and a lower work function control gate material 413 as part of the sublayer 235. Line 401 shows a boundary between the different control gate materials. A channel portion 410 is a portion of the channel 405 of the NAND string which is directly adjacent to the higher work function control gate material 412. A channel portion 411 is a portion of the channel 405 of the NAND string which is directly adjacent to the lower work function control gate material 413.

Lcg_sgd is a length of a channel of the SGD transistor 268d. This is the height of the layer SGLdwf. Lcg_sgd_high is a length of the sublayer 234, and Lcg_sgd_low is a length of the sulayer 235. In one approach, Lcg_sgd_high and Lcg_sgd_low are approximately equal to each other, and equal to one half of Lcg_sgd. However, other approaches are possible.

An example memory cell (MC) is adjacent to the SGD transistor. The memory cell has a drain side Dr1 on one side, facing the bit line, and a source side Sr1, on the other side. Lcg_mc is a length of a channel of the memory cell. This is the height of the layer WLL23. The memory cell includes a control gate 430 and a directly adjacent channel region 431.

Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 402, a nitride such as SiN as a charge trapping layer (CTL) can be deposited as layer 403 and a tunnel oxide (TNL) can be deposited as layer 404, to provide the O—N—O layers. Further, a polysilicon body or channel (CH) 405 can be deposited as layer, and a core filler dielectric can be deposited as region 406. Additional memory cells are similarly formed throughout the columns.

When a memory cell is programmed, electrons are stored in a portion of the CTL which is associated with the memory cell. For example, electrons are represented by "–" symbols in the CTL for the MC. These electrons are drawn into the CTL from the channel, and through the TNL. The Vth of a memory cell is increased in proportion to the amount of stored charge. A 3D memory device typically stores charge in a charge trapping layer while a 2D memory device can store charge in a charge trapping layer or in a floating gate.

Each of the memory holes is thus filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B depicts a cross-section view of the column C0 of FIG. 4A through the higher work function sublayer 234 of the SGD transistor 268d. Each layer is ring-shaped in one possible approach, except the core filler, which is a cylinder.

FIG. 4C depicts a view of the region 246 of FIG. 2D1 showing the SGD transistors 274d, 278d and 282d above a memory cell (MC).

The SGD transistor 274d has a drain side Dr2 on one side, facing the bit line, and a source side Sr2 on the other side. Lcg_sgd1 (the height of the layer SGL1) is a length of a channel of the SGD transistor. Also, the SGD transistor includes a control gate 420 and a directly adjacent channel portion 421.

The SGD transistor 278d has a drain side Dr3 on one side, facing the bit line, and a source side Sr3 on the other side. Lcg_sgd2 (the height of the layer SGL2) is a length of a channel of the SGD transistor. Also, the SGD transistor includes a control gate 422 and a directly adjacent channel portion 423.

The SGD transistor 282d has a drain side Dr4 on one side, facing the bit line, and a source side Sr4 on the other side. Lcg_sgd3 (the height of the layer SGL3) is a length of a channel of the SGD transistor. Also, the SGD transistor includes a control gate 424 and a directly adjacent channel portion 425.

An example memory cell (MC) is adjacent to the SGD transistors. The memory cell has a drain side Dr5 on one side, facing the bit line, and a source side Sr5, on the other side. Lcg_mc is a length of a channel of the memory cell. This is the height of the layer WLL21. Also, the memory cell includes a control gate 426 and a directly adjacent channel portion 427.

In one approach, the channel lengths of the SGD transistors and the memory cell are approximately equal to each other. Thus, the respective conductive layers (w.g., WLL0-WLL21) which are connected to the plurality of memory cells and the respective conductive layers (e.g., SGL1, SGL2) of the first and second drain-end select gate transistors, can have a substantially equal height. For example, their heights can be within +/−5-10% of each other. This facilitates the fabrication of the memory device. In another approach, the channel lengths of the SGD transistors are approximately equal to each other but are different than Lcg_mc.

The above discussion focused on a 3D non-volatile memory device. The techniques described herein are also applicable to a 2D non-volatile memory device. One example embodiment is described below.

FIG. 5A depicts a 2D NAND configuration of a block of flash memory cells in the memory array 126 of FIG. 1B and associated sense blocks SB0, SB1, SB2 . . . . The memory array can include many blocks. An example block BLK0 includes a number of NAND strings and respective bit lines, e.g., BL0-BL11, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line (SL). Sixty-four word lines, for example, WL0-WL63, extend between the source select gates and the drain select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively.

An example NAND string 500 includes example memory cells 508, 510, 512, 514, . . . , 520 and 522, connected to word lines WL1, WL2, WL3, . . . , WL7, respectively. The NAND also includes an SGS transistor 506 and a SGD transistor 524 connected to respective control lines. The memory cells of BLK0 and other blocks, not shown, are formed in a well region in a substrate. In the NAND configuration, the memory cells are arranged in a string in which the source terminal of one cell is connected to the drain terminal of an adjacent cell.

Other types of non-volatile memory in addition to NAND flash memory can also be used. For example, another type of memory cell useful in flash EEPROM systems utilizes a non-conductive dielectric material as a charge trapping layer in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the memory cell channel into the nitride, where they are trapped and stored in a limited region. This stored charge then changes the Vth of a portion of the channel of the memory cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 5B depicts a cross-sectional view of the NAND string NS0 of FIG. 5A as formed on a substrate, where a dual work function SGD transistor 513d includes control gates portions 511 and 523 with higher and lower work functions, respectively. A channel region 515 can extend in the substrate as part of the NAND string. A portion of the channel is associated with each transistor. For example, the SGD transistor 513d has a channel length of Lcg, between a drain side Dr6 and a source side Sr6. Each portion of the transistor can have a respective channel length which is a portion of Lcg, such as one half. The control gate portions 511 and 523 are directly adjacent to and directly above the channel regions 591 and 593, respectively.

The view is simplified and not to scale. In this approach, the substrate 590 employs a triple-well technology which includes a p-well region 592 within an n-well region 594, which in turn is within a p-type substrate region 596 (as a third well). The source/drain regions are n-type.

The NAND string 500 also includes the SGS transistor 506, and the memory cells 508, 510, 512, 514, 516, 518, 520 and 522, formed on the substrate. A number of source/drain regions, one example of which is source drain/region 530, are provided on either side of each storage element and the select gate transistors 506 and 513d. A source supply line 504 with a potential of Vsl is provided in addition to a bit line 526 with a potential of Vbl. In one possible approach, a body (or bulk) bias voltage, Vb, is applied to the p-well region 592 via a terminal 502. A voltage can also be applied to the n-well region 594 via a terminal 503.

Figure 5C:
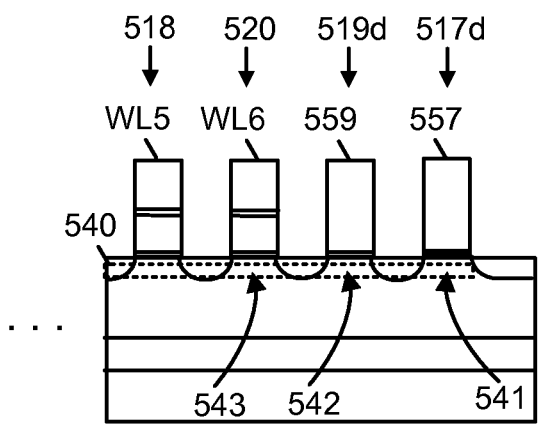
FIG. 5C depicts a variation of FIG. 5B, and includes two SGD transistors 517$d$ and 519$d$.

FIG. 5C depicts a variation of FIG. 5B, and includes two SGD transistors 517d and 519d comprising control gates 557 and 559, respectively. Each transistor can have a different work function, in one approach. For instance, SGD transistor 517d can have a higher work function and SGD transistor 519d, adjacent to memory cell 520, can have a lower work function. Alternatively or additionally, each transistor can have a different control gate overdrive voltage. For instance, SGD transistor 517d can have a lower control gate overdrive voltage and SGD transistor 519d, adjacent to memory cell 520, can have a higher control gate overdrive voltage.

A channel region 540 of the NAND string includes portions 541, 542 and 543 which are directly adjacent and directly under transistor 517d, transistor 519d and memory cell 518, respectively. In one approach, the SGD transistors differ from memory cells in that they do not include a floating gate or charge trapping layer.

Figure 5D:
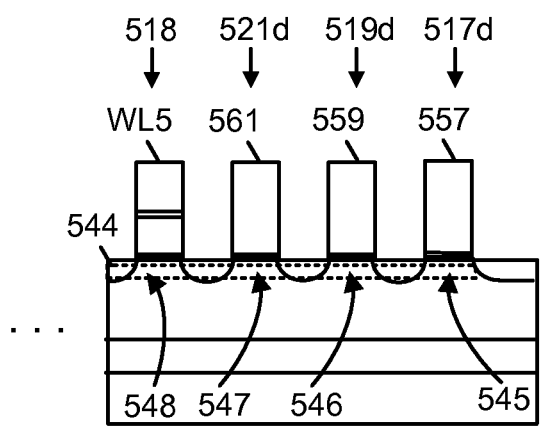
FIG. 5D depicts another variation of FIG. 5B, and includes three SGD transistors 517$d$, 519$d$ and 521$d$.

FIG. 5D depicts another variation of FIG. 5B, and includes three SGD transistors 517d, 519d and 521d with control gates 557, 559 and 561, respectively. At least two of the transistors can have a different work function, in one approach. For instance, SGD transistor 517d can have a higher work function and SGD transistor 519d and/or 521d, adjacent to memory cell 518, can have a lower work function. A channel region 544 of the NAND string includes portions 545, 546, 547 and 548 which are directly adjacent and directly under transistor 517d, transistor 519d, transistor 521d and memory cell 518, respectively.

Figure 6A:
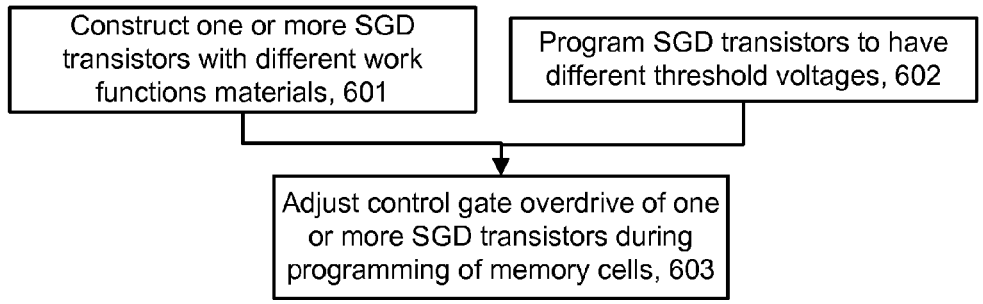
FIG. 6A depicts a process for providing one or more SGD transistors with different work functions and/or threshold voltages.

FIG. 6A depicts a process for providing one or more SGD transistors with different work functions and/or threshold voltages. Step 600 involves configuring work functions of one or more SGD transistors before programming memory cells. A select gate device can be considered to include one or more SGD transistors. Step 601 involves constructing one or more SGD transistors with different work function materials, e.g., during the fabrication of the memory device. For instance, the control gate materials can have different work functions. For the stacked 3D memory, the control gate material may be deposited as a layer in the stack.

Many different types of materials can be used for the control gate. For example, p+ polysilicon has a relatively high work function. The p+ polysilicon can comprise a p+ doping concentration of at least 1E18 atoms/cm$^3$, for instance, using p-type ions such as Boron. Moreover, n+ polysilicon has a relatively low work function, and can comprise an n+ doping concentration of at least 1E18 atoms/cm$^3$, using n-type ions. P-type polysilicon has a work function of about 4.65 eV at a lower saturation current to 5.2 at a higher saturation current. N-type polysilicon has a work function of about 4.1 eV at a lower saturation current to 4.6 eV at a higher saturation current. The work function can be tuned by adjusting the type and level of doping. Thus, in one approach, the first control gate material comprises p+ polysilicon and the second control gate material comprises n+ polysilicon.

After the word line layers have been deposited, a polysilicon layer can be deposited and doped to provide the n+ polysilicon layer. Subsequently, an optional dielectric layer can be deposited. Subsequently, a polysilicon layer can be deposited and doped to provide the p+ polysilicon layer.

Another approach is to provide a metal as the select gate material. Or, one portion can be metal and another portion polysilicon. Metals and their intrinsic work functions include cobalt (5.0 eV), platinum (5.7 eV), molybdenum (4.6 eV) and tungsten (4.55-5.3 eV), or metal silicides such as nickel silicide (4.5 eV) titanium silicide (4.52 eV), tungsten silicide (4.55 eV), cobalt silicide (4.75 eV), and molybdenum silicide (4.8 eV). Another example material is titanium nitride (4.55 eV). Other, lower work function metals includes Samarium (Sm) and alkali metals. In one approach, the metal can be provided as a metal silicide which is formed by depositing metal on polysilicon and annealing. Thus, at least one of the first or second control gate materials comprises metal silicide. In some cases, a portion of a polysilicon layer is silicide so that a layer comprises both polysilicon and silicide. Or, at least one of the first or second control gate materials comprise a metal.

A control gate material can be provide using one or more of the above-mentioned materials. Generally, a larger benefit can be achieved when the difference in work function is larger. As an example, a work function difference of 0.25, 0.5 or 1 V or more can be used.

Step 602 involves programming the SGD transistors to have different threshold voltages. For example, an SGD transistor has a charge trapping layer which can be programmed to store a charge. This can occur, e.g., before or after the memory device is delivered to the end user. A higher Vth results in a higher work function. If the SGD transistors are connected to independent control lines, they can be programmed to different Vth levels. Two or more SGD transistors connected to a common control line can be programmed to a common Vth level.

Step 603 involves adjusting the control gate overdrive of one or more SGD transistors during programming of memory cells One or more of steps 601-603 can be performed. See FIG. 6B for further example details.

Figure 6B:
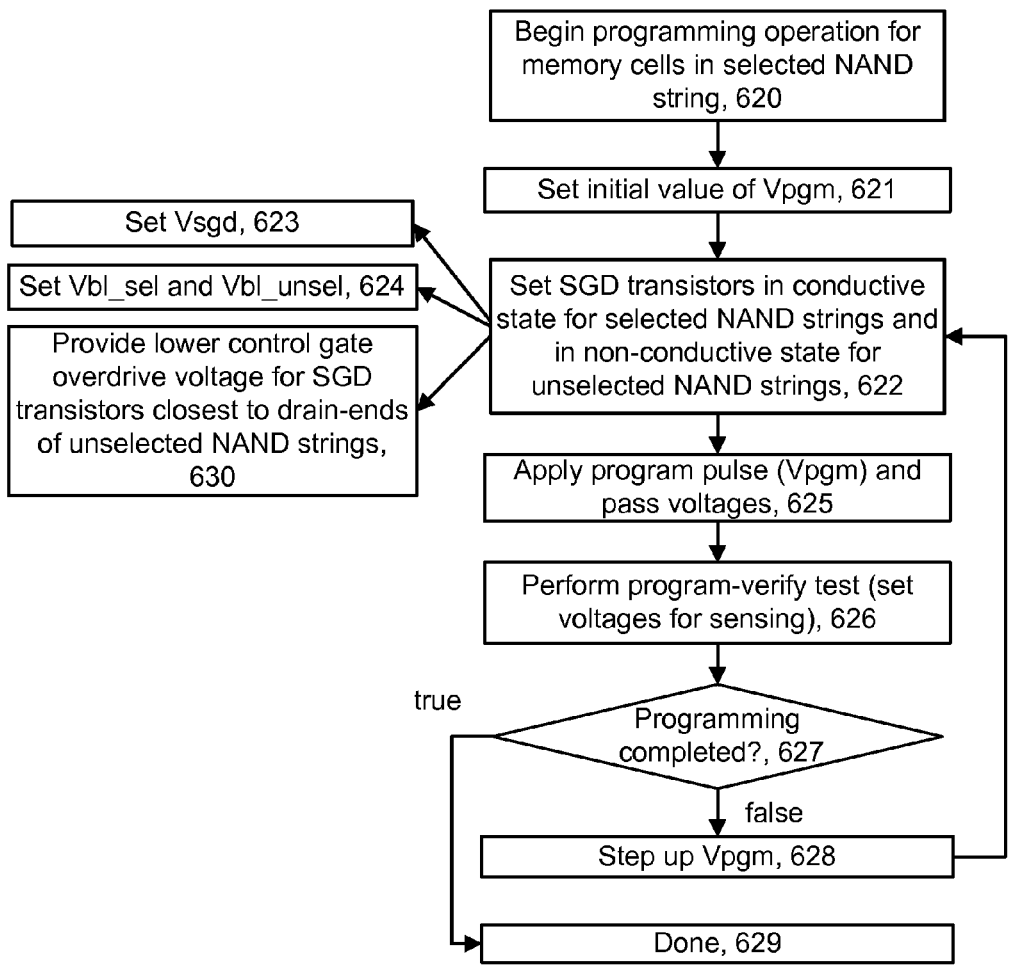
FIG. 6B depicts an example of a programming operation for memory cells consistent with FIG. 6A.

FIG. 6B depicts an example of a programming operation for memory cells consistent with FIG. 6A. Step 620 begins a programming operation for memory cells in selected NAND strings, in a set of NAND strings (e.g., set 267 in FIG. 2E1 or set 377 in FIG. 3D1). Typically, a set of memory cells on a selected word line layer will be programmed together in a program operation. The set can include selected memory cells which are to be programmed to a target data state, and unselected memory cells which are to remain in an erased state. During the programming operation, the selected memory cells that complete programming are classified as unselected memory cells. The remaining word line layers may be unselected word line layers which are connected to unselected memory cells.

Step 621 sets an initial value of the program voltage or pulse, Vpgm. Step 622 provides the SGD transistors in a conductive state for the selected NAND strings to allow the selected memory cells to be programmed, while providing the SGD transistors in a non-conductive state for the unselected NAND strings to inhibit the unselected memory cells from being programmed. The unselected memory cells are connected to the selected word line layer and to the remaining, unselected word line layers.

Step 622 can include setting Vsgd on the control gates of the SGD transistors (step 623). One approach includes setting Vsgd higher on an SGD transistor which is closest to the bit line or drain end of the NAND string (e.g., SGD1, see FIG. 7A-7H) than on other SGD transistors (e.g., SGD2 or SGD3). Another approach sets a common Vsgd on the SGD transistors. See FIG. 7A-7H for further details. Step 622 can further involve providing a lower control gate overdrive voltage for the SGD transistors closest to the drain-ends of the unselected NAND strings (relative to a control gate overdrive voltage for the SGD transistors which are not closest to the drain-ends of the unselected NAND strings), at step 630. The control gate overdrive voltage (Vod) for an SGD transistor is Vgs–Vth, where Vgs is the control gate voltage (Vg=Vsgd) minus the source voltage (Vs) and Vth is the threshold voltage. Thus, for a given source voltage, the control gate overdrive voltage is larger when Vg is larger or when Vth is smaller. In other words, the control gate overdrive voltage is smaller when Vg is smaller or when Vth is larger. The channel potential under the SGD transistor is larger when the control gate overdrive voltage is larger.

While the SGD transistors are set in the conductive or non-conductive states, step 624 includes setting Vbl_sel and Vbl_unsel, where Vbl_unsel>Vbl_sel. With Vsgd, Vbl_sel and Vbl_unsel set, step 625 includes applying a program pulse to the selected word line layer and a pass voltage to the unselected word line layers. A channel region of the unselected NAND strings is boosted by these voltages since the associated SGD transistors are in a non-conductive state. That is, a boosted voltage can be maintained in the channel. Further, a discontinuous channel potential is created adjacent to the SGD transistors, as explained further in connection with FIGS. 8A-8D. A channel region of the selected NAND strings is not boosted by these voltages since the associated SGD transistors are in a conductive state.

Step 626 performs a program-verify test, including setting voltages for sensing. This can include applying a program-verify voltage to the selected word line layer, applying a pass voltage to the unselected word line layers, and determining whether the selected NAND strings are in a conductive or non-conductive state. The program-verify test is passed for a selected NAND string in the non-conductive state, and the selected NAND string becomes classified as an unselected NAND string in a next iteration. At decision step 627, if all, or a sufficient number of the selected memory cells have passed the program-verify test, the programming operation is done at step 629. If decision step 627 is false, Step 628 steps up Vpgm and a next iteration begins at step 622.

Figure 7A:
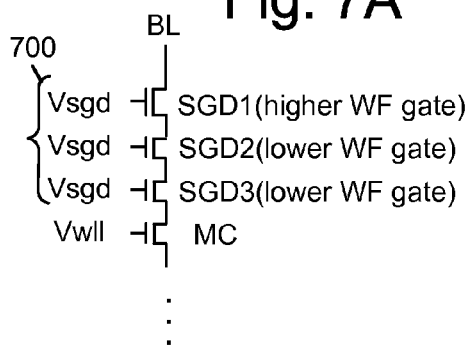
FIG. 7A depicts an embodiment of a NAND string which includes three SGD transistors, at least two having different work functions, consistent with step 601 of FIG. 6A.

FIG. 7A depicts an embodiment of a NAND string which includes three SGD transistors, at least two having different work functions, consistent with step 601 of FIG. 6A. As mentioned, techniques provided herein prevent or reduce a decrease in the Vsgd window by providing one or more drain-end SGD transistors which have multiple work functions. In the approaches of FIG. 7A-7D, one or more SGD transistors are constructed with control gates having different work function materials. The work function of a material refers, e.g., to an amount of energy needed to remove an electron from the material to a point immediately outside the surface of the material (or the energy needed to move an electron from the Fermi energy level into vacuum). The higher work function material is before the lower work function material, relative to the bit line or the drain end of the NAND string. This results in a discontinuous channel potential (Vch) for an unselected NAND string which reduces DIBL and thereby avoids a reduction in the Vsgd window. See, e.g., FIG. 8A-8D.

By providing a discontinuous channel potential, a high transconductance and reduced short-channel effect can be realized under the boundary of the different work function SGD transistors.

The potential of a channel region which is directly adjacent to a transistor is proportional to the control gate voltage of the transistor and inversely proportional to the work function of the control gate. Thus, a control gate with a higher work function results in a lower channel potential. The work function of a control gate can vary due to a control gate material, Vsgd and/or Vth.

Figure 7B:
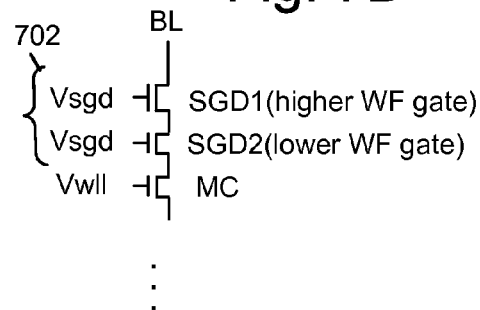
FIG. 7B depicts an embodiment of a NAND string which includes two SGD transistors having different work functions, consistent with step 601 of FIG. 6A.
Figure 7C:
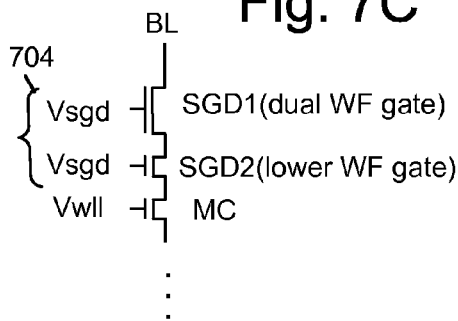
FIG. 7C depicts an embodiment of a NAND string which includes a dual work function SGD transistor having portions with different work function materials, and a second SGD transistor having a single work function material, consistent with step 601 of FIG. 6A.
Figure 7D:
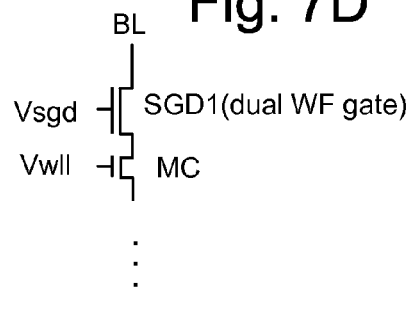
FIG. 7D depicts an embodiment of a NAND string which includes a dual work function SGD transistor having portions with different work function materials, adjacent to a memory cell, consistent with step 601 of FIG. 6A.
Figure 7E:
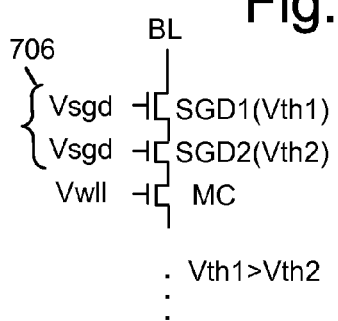
FIG. 7E depicts an embodiment of a NAND string which includes two SGD transistors which are programmed to different threshold voltages to provide different control gate overdrive voltages, consistent with step 602 of FIG. 6A.
Figure 7F:
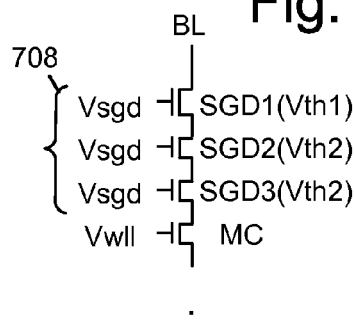
FIG. 7F depicts an embodiment of a NAND string which includes three SGD transistors, at least two of which are programmed to different threshold voltages to provide different control gate overdrive voltages, consistent with step 602 of FIG. 6A.
Figure 7G:
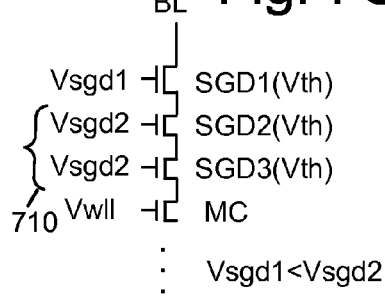
FIG. 7G depicts an embodiment of a NAND string which includes three SGD transistors, at least two of which have different control gate voltages during programming to provide different control gate overdrive voltages, consistent with step 603 of FIG. 6A.
Figure 7H:
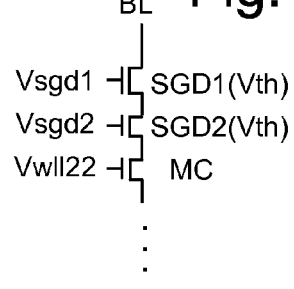
FIG. 7H depicts an embodiment of a NAND string which includes two SGD transistors having different control gate voltages during programming to provide different control gate overdrive voltages, consistent with step 603 of FIG. 6A.

In the approaches of FIGS. 7E and 7F, different SGD transistors for a NAND string are provided with different control gate overdrive voltages by being programmed to different threshold voltages. As mentioned, the control gate overdrive voltage of an SGD transistor (or a transistor in general) is Vgs–Vth, where Vg=Vsgd, so a higher Vth results in a lower control gate overdrive voltage and a higher channel potential under the SGD transistor. In the approaches of FIGS. 7G and 7H, different SGD transistors for a NAND string are provided with different control gate overdrive voltages by applying different control gate voltages. A lower Vsgd results in a lower control gate overdrive voltage and therefore a lower channel potential under the SGD transistor.

A combination of these approaches can be used as well. For example, a lower control gate overdrive voltage can be achieved by a higher Vth and a lower Vsgd. Also, a lower control gate overdrive voltage can be achieved by a higher work function material in the control gate and one or both of a higher Vth and a lower Vsgd.

In FIG. 7A, SGD1, SGD2 and SG3 are first, second and third drain-end select gate (SGD) transistors, respectively, where SGD1 is closest to the drain end of the NAND string. MC is a memory cell which is adjacent to one of the SGD transistors. The NAND string includes additional memory cells which are between the SGD transistors and a source-end select gate (SGS) transistor. In this example, a common voltage Vsgd is applied to each of the SGD transistors. Further, SGD1 has a relatively higher work function (WF) material for its control gate and SGD2 and SGD3 have a relatively lower work function material for their control gates. In one approach, SGD2 and SGD3 have a common work function material for their control gates. In another approach, the control gate of SGD3 has a lower work function than a control gate of SGD2. Vwll is an example voltage applied to the memory cell via its word line layer.

As mentioned, the higher work function material can be p+ polysilicon while the lower work function material is n+ polysilicon, one or more of the work function materials can be metal silicide, and/or one or more of the work function materials can be a metal, for instance.

In one approach, the length of the control gates for each of the SGD transistors is the same, e.g., within +/−5-10%. Further, this length can be the same as the length of the control gates for the memory cells. This facilitates the fabrication of the stack since each conductive layer (which provides each respective control gate) is the same. Moreover, the etching of the memory holes is facilitated by having conductive layers with a common height since a more uniform width of the memory holes can be achieved. Further, multiple smaller SGD transistors can provide the same capability as a single SGD transistor when the sum of the control gate lengths of the smaller SGD transistors is about the same as the control gate length of a single larger SGD transistor. The multiple smaller SGD transistors can be considered to be a select gate device which has a same capability as a single larger SGD transistor to provide the drain end of an unselected NAND string in a non-conductive state so that channel boosting can occur to inhibit programming. In contrast, if a single small SGD transistor were used at the drain end of a NAND string, it may not be able to prevent current leakage between the channel and the bit line.

Since the control gates of the multiple SGD transistors receive a common Vsgd in this example, potentially these control gates can be connected, e.g., by connecting the respective conductive layers which provide the control gates. This connection can be made where the conductive layers meet a voltage driver, for instance. In this case, these control gates can be driven by a common voltage driver, potentially reducing the complexity of the memory device. Bracket 700 represents an optional connecting path between the control gates.

The approaches described herein therefore have the advantages of reducing DIBL due to the different work functions, facilitating fabrication due to multiple smaller SGD transistors, and reduced complexity due to the potential to commonly drive the multiple smaller SGD transistors.

FIG. 7B depicts an embodiment of a NAND string which includes two SGD transistors having different work functions, consistent with step 601 of FIG. 6A. This example is similar to the example of FIG. 7A except two SGD transistors are used instead of three. The control gates of these transistors can be slightly larger than in FIG. 7A, in one approach, to provide a consistent total channel length. In this example, a common voltage Vsgd is applied to each of the SGD transistors, while SGD1 has a relatively higher work function material for its control gate and SGD2 has a relatively lower work function material for its control gate. Bracket 702 represents an optional connecting path between the control gates.

FIG. 7C depicts an embodiment of a NAND string which includes a dual work function SGD transistor having portions with different work function materials, and a second SGD transistor having a single work function material, consistent with step 601 of FIG. 6A. SGD1 has a dual work function gate, or generally, a multi-work function gate having two or more control gate materials with different work functions. SGD2 has a control gate material with a lower work function which can be equal to, or less than, the lower work function of SGD1. In one approach, the control gate length of SGD1 is larger than for SGD2. In this example, a common voltage Vsgd is applied to each of the SGD transistors. Bracket 704 represents an optional connecting path between the control gates.

FIG. 7D depicts an embodiment of a NAND string which includes a dual work function SGD transistor having portions with different work function materials, adjacent to a memory cell, consistent with step 601 of FIG. 6A. This example is similar to the example of FIG. 7C except one SGD transistor is used instead of two. The control gate of this transistor can be slightly larger than in FIG. 7C to provide a consistent total channel length.

FIG. 7E depicts an embodiment of a NAND string which includes two SGD transistors which are programmed to different threshold voltages to provide different control gate overdrive voltages, consistent with step 602 of FIG. 6A. As mention, the SGD transistors can be programmed before memory cells are programmed. For example, this can occur before and/or after the memory device is delivered to the end user. One approach is to program the SGD transistors when the memory device is being manufactured. The programmed Vth is expected to remain relatively constant over the life of the memory device. However, it is possible for the memory device to periodically measure the Vth to determine if it is within an acceptable range, and to re-program the SGD transistors if necessary. In one approach, each SGD transistor can be driven independently during programming of the SGD transistors. During programming of memory cells, the SGD transistors can be commonly driven, in one approach.

In this example, SGD1 is programmed to Vth1 and SGD2 is programmed to Vth2, where Vth1>Vth2. The programming can follow a process similar to that of FIG. 6B in which multiple program-verify iterations are performed until the Vth of the SGD transistor reaches a verify level. In one approach, a larger program pulse is used to program SGD1. A transistor with a higher Vth will have a lower control gate overdrive voltage than a transistor with a lower Vth. As an example, Vth1 can exceed Vth2 by 0.5-1 V or more. Bracket 706 represents an optional connecting path between the control gates.

FIG. 7F depicts an embodiment of a NAND string which includes three SGD transistors, at least two of which are programmed to different threshold voltages to provide different control gate overdrive voltages, consistent with step 602 of FIG. 6A. This approach is similar to FIG. 7E except three SGD transistors are used instead of two. The Vth of SGD3 can be less than or equal to the Vth of SGD2. In one approach, SGD2 and SGD3 are commonly driven during programming of the SGD transistors, and during programming of memory cells. SGD1 can be driven independently of SGD2 and SGD3. Bracket 708 represents an optional connecting path between the control gates.

FIG. 7G depicts an embodiment of a NAND string which includes three SGD transistors, at least two of which have different control gate voltages during programming to provide different control gate overdrive voltages, consistent with step 603 of FIG. 6A. This approach uses different Vsgd levels during programming of memory cells to provide different control gate overdrive voltages. In one approach, the SGD transistors all have a common Vth. For example, Vsgd1 can be applied to SGD1, while Vsgd2 is applied to SGD2 and SGD3, where Vsgd1<Vsgd2. A transistor with a lower Vsgd will have a lower control gate overdrive voltage. As an example, Vsgd2 can exceed Vsgd1 by 0.5-1 V or more. Bracket 710 represents an optional connecting path between the control gates.

In one approach, the first drain-end select gate transistors (SGD1) have a lower control gate overdrive voltage than the second drain-end select gate transistors (SGD2) due to Vsgd1<Vsgd2 and/or due to Vth of SGD1>Vth of SGD2.

FIG. 7H depicts an embodiment of a NAND string which includes two SGD transistors having different control gate voltages during programming to provide different control gate overdrive voltages, consistent with step 603 of FIG. 6A. This approach is similar to FIG. 7G except two SGD transistors are used instead of three. In one approach, the SGD transistors all have a common Vth. For example, Vsgd1 can be applied to SGD1, while Vsgd2 is applied to SGD2, where Vsgd1<Vsgd2.

In the above examples, more than three SGD transistors can be used in a NAND string, as a further variation.

For a U-shaped NAND string in a 3D memory device, the SGS transistors can have a similar construction as the SGD transistors since they are at a common level in the stack. For example, each SGD transistor in FIG. 7A-7H can have a counterpart SGS transistor with a same control gate material. However, the Vth and Vsgs for the SGS transistors can be independent of the SGD transistors.

For a straight NAND string in a 3D memory device, the SGS transistors can have a different construction than the SGD transistors since they are at different levels in the stack. For example, one SGS transistor can be used even when multiple SGD transistors are used. The Vth and Vsgs for the SGS transistors can also be independent of the SGD transistors.

For a NAND string in a 2D memory device, the SGS transistors can have a different construction than the SGD transistors since they are at different locations on a substrate. For example, one SGS transistor can be used even when multiple SGD transistors are used. The Vth and Vsgs for the SGS transistors can also be independent of the SGD transistors.

It is also possible to combine techniques so that a desired work function and/or control gate overdrive voltage can be achieved for an SGD transistor by a combination of two or more of: control gate voltage, control gate material, Vsgd and Vth of the transistor.

Figure 8A:
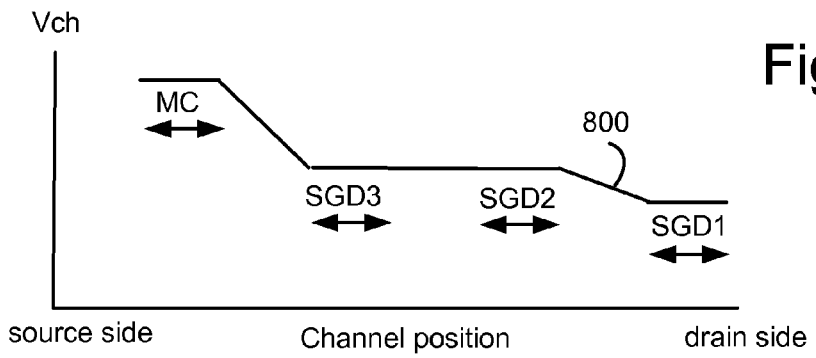
FIG. 8A depicts a plot of channel potential versus channel position for an unselected NAND string during programming, consistent with FIG. 7A, 7F or 7G.

FIG. 8A depicts a plot of channel potential versus channel position for an unselected NAND string during programming, consistent with FIG. 7A, 7F or 7G. The horizontal axis depicts a channel position in a NAND string, extending from a source side to a drain side, and the vertical axis depicts a channel potential, Vch. As mentioned, the potential of a portion of a channel which is directly adjacent to a transistor is a function of the control gate voltage, the intrinsic work function of the control gate material, Vsgd and Vth of the transistor. It can also be said that the channel potential is a function of the work function of the transistor, where the work function is a function of intrinsic properties such as the control gate material, and controllable factors such as Vsgd and Vth. A higher work function of the transistor is achieved by a higher work function gate material, a higher Vth or a lower Vsgd.

In this example, SGD1 has a relatively higher work function, and SGD2 and SGD3 have an equal and relatively lower work function. Or, SGD1 has a relatively lower control gate overdrive voltage, and SGD2 and SGD3 have an equal and relatively higher control gate overdrive voltage. As a result, a channel portion of SGD1 will have a lower Vch than a channel portion of SGD2 and SGD3. A channel portion of the memory cell is relatively high, in this example.

Example channel portions for SGD1, SGD2 and SGD3 are channel portions 421, 423 and 425, respectively, in FIG. 4C, and channel portions 545, 546 and 547, respectively, in FIG. 5D. A discontinuity 800 in Vch occurs as a marked increase in Vch between SGD1 and SGD2.

Figure 8B:
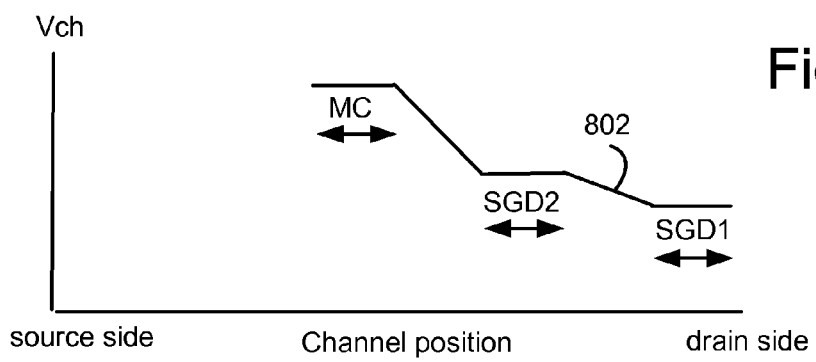
FIG. 8B depicts a plot of channel potential versus channel position for an unselected NAND string during programming, consistent with FIG. 7B, 7E or 7H.

FIG. 8B depicts a plot of channel potential versus channel position for an unselected NAND string during programming, consistent with FIG. 7B, 7E or 7H. In this example, SGD1 has a relatively higher work function, and SGD2 has a relatively lower wok function. Or, SGD1 has a relatively lower control gate overdrive voltage, and SGD2 has a relatively higher control gate overdrive voltage. As a result, a channel portion of SGD1 will have a lower Vch than a channel portion of SGD2. Example channel portions for SGD1 and SGD2 are channel portions 421 and 423, respectively, in FIG. 4C, channel portions 541 and 542, respectively, in FIG. 5C, and channel portions 545 and 546, respectively, in FIG. 5D. A discontinuity 802 in Vch occurs as a marked increase in Vch between SGD1 and SGD2.

Figure 8C:
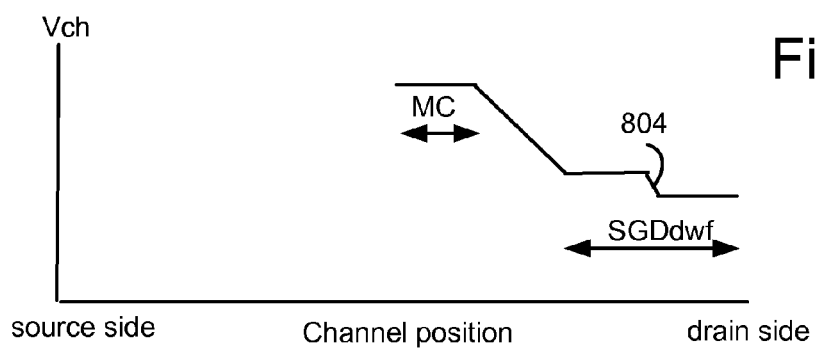
FIG. 8C depicts a plot of channel potential versus channel position for an unselected NAND string during programming, consistent with FIG. 7D.

FIG. 8C depicts a plot of channel potential versus channel position for an unselected NAND string during programming, consistent with FIG. 7D. In this example, SGDdwf has a relatively higher and lower work function portions. As a result, channel portions of the relatively higher and lower work function portions will be relatively lower and higher, respectively. Example channel portions for SGDdwf are channel portions 410 and 411, respectively, in FIG. 4A, and channel portions 591 and 593, respectively, in FIG. 5B. A discontinuity 804 in Vch occurs as a marked increase in Vch between the two control gate portions of SGDdwf.

Figure 8D:
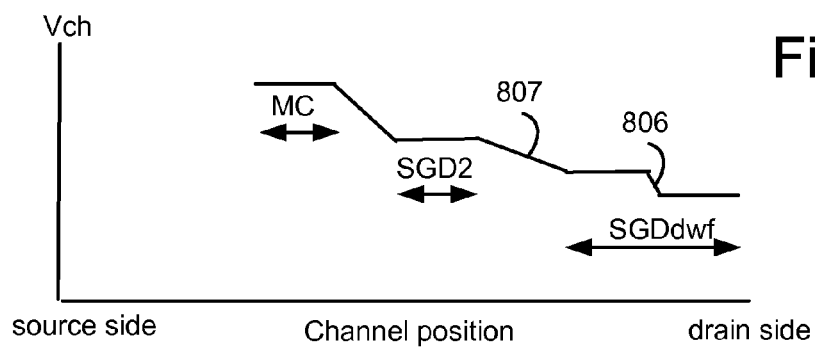
FIG. 8D depicts a plot of channel potential versus channel position for an unselected NAND string during programming, consistent with FIG. 7C.

FIG. 8D depicts a plot of channel potential versus channel position for an unselected NAND string during programming, consistent with FIG. 7C. Example channel portions for SGDdwf are channel portions 410 and 411, respectively, in FIG. 4A, and channel portions 591 and 593, respectively, in FIG. 5B. Example channel portions for SGD2 are channel portion 423, 542 and 546 in FIG. 4C, FIG. 5C and FIG. 5D, respectively. Discontinuities 806 and 807 in Vch occur under SGDdwf, and between SGDdwf and SGD2, respectively.

Figure 9A:
FIGS. 9A and 9B depict a one pass programming operation with four data states.
Figure 9B:
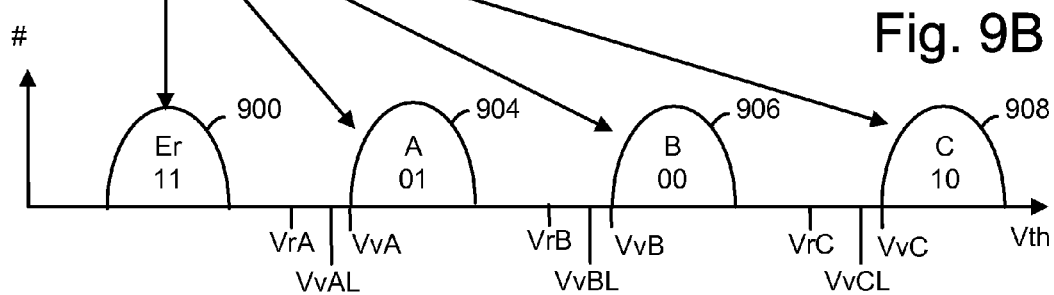

FIGS. 9A and 9B depict a one pass programming operation with four data states. One pass programming is also referred to as "one-pass write" programming which involves a sequence of multiple program-verify operations which are performed starting from an initial Vpgm level and proceeding to a final Vpgm level until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 900 is provided for erased (Er) state memory cells. Three Vth distributions 904, 906 and 908 represent target data states A, B and C, respectively, which are reached by memory cells when their Vth exceeds the nominal (higher) verify level VvA, VvB or VvC, respectively. In this case, each memory cell can store two bits of data in one of four possible Vth ranges, referred to as states Er (or E), A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvAL, VvBL or VvCL) are defined such that the memory cells enter a slow programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a memory cell exceeds the lower verify level associated with the target data state of the memory cell, a slow programming mode begins for the memory cell. Subsequently, when a verify test determines that the Vth of a memory cell exceeds the higher verify level associated with the target data state of the memory cell, the memory cell is inhibited from further programming. In some cases, QPW is used on fewer than all target data states.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B- and C-states. Read reference voltages which are between the distributions are used for reading data from the memory cells. By testing whether the Vth of a given memory cell is above or below one or more of the read reference voltages, the system can determine the data state which is represented by a memory cell.

Figure 10A:
FIGS. 10A to 10C depict a two pass programming operation with four data states.
Figure 10B:
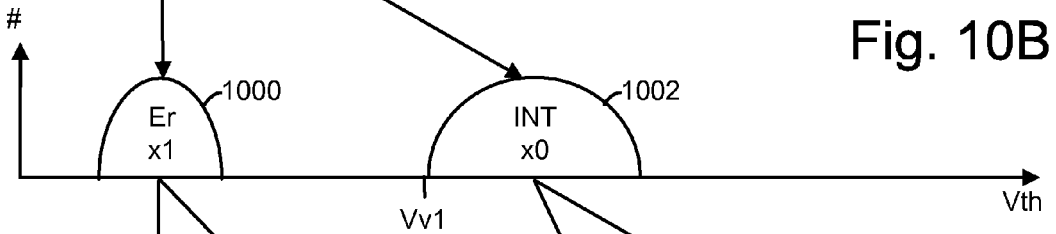
Figure 10C:
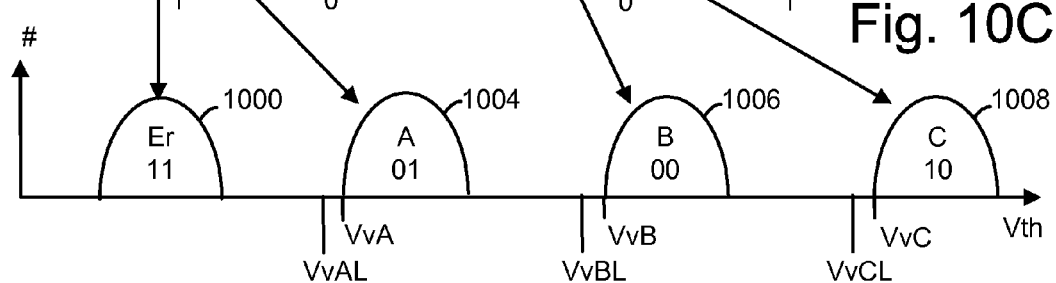

FIGS. 10A to 10C depict a two pass programming operation with four data states. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 1000 in FIG. 10A.

FIG. 10B depicts programming of a lower page of data. If the lower page has a bit=1, the associated memory cell remains in the distribution 1000 and the data is represented by x1, where x is an upper page bit that is not yet known. If the lower page has a bit=0, the memory cell is programmed to a higher Vth as represented by distribution 1002, which is an interim distribution (INT), using a verify level Vvl. The data of these memory cells is represented by x0. Note that the interim distribution can be relatively wide since it is not a final distribution and does not represent a final data state.

FIG. 10C depicts programming of an upper page of data. If UP/LP=11, the associated memory cell in the distribution 1000 remains in the distribution 1000 and stores data bits 11. If UP/LP=01, the memory cells in the distribution 1000 are programmed to the distribution 1004 (state A) and a slow programming mode is used when the Vth is between VvAL and VvA. If UP/LP=10, the memory cells in the distribution 1002 are programmed to the distribution 1008 (state C) and a slow programming mode is used when the Vth is between VvCL and VvC. If UP/LP=00, the memory cells in the distribution 1002 are programmed to the distribution 1006 (state B) and a slow programming mode is used when the Vth is between VvBL and VvB.

Programming can be similarly extended to three or more bits per memory cell.

Figure 11:
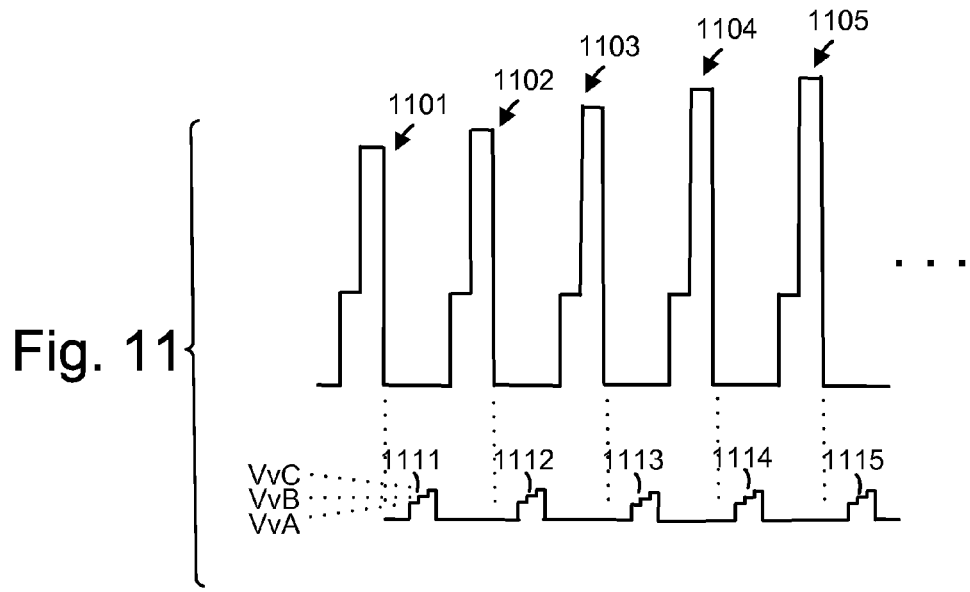
FIG. 11 depicts program and verify voltages for programming memory cells of a selected word line layer, in accordance with FIG. 6B.

FIG. 11 depicts program and verify voltages for programming memory cells of a selected word line layer, in accordance with FIG. 6B. A programming operation may include multiple program-verify iterations or loops, where each program-verify iteration includes a programming portion comprising a program pulse and a following verify operation comprising one or more verify voltages. The program pulse and verify voltages are applied to a selected WLL.

In one approach, the program pulses are stepped up in successive iterations by a step size, dVpgm. Moreover, each program pulse may include a first portion which has a pass voltage (Vpass) level, e.g., 6-8 V, followed by a second, peak amplitude portion at a program level, e.g., 12-25 V. For example, this programming pass includes program pulses 1101-1105 and associated sets of verify pulses 1111-1115, respectively. In this example, the verify pulses have a magnitude of VvA, VvB and VvC.

Figure 12A:
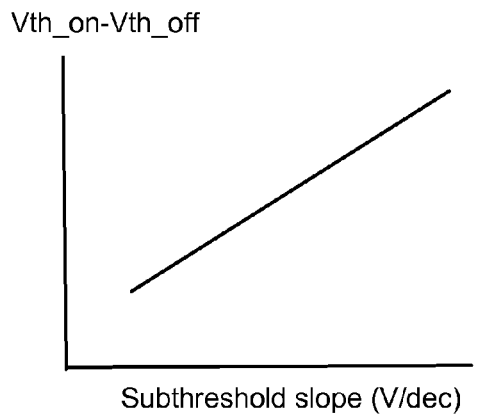
FIG. 12A depicts a plot of Vth_on–Vth_off versus sub-threshold slope, for an SGD transistor.

FIG. 12A depicts a plot of Vth_on–Vth_off versus subthreshold slope, for an SGD transistor. The subthreshold slope is a feature of a MOSFET's current-voltage characteristic. In the subthreshold region, a plot of logarithmic drain current versus gate voltage with drain, source, and bulk voltages fixed will exhibit approximately linear behavior. The slope of this plot is the subthreshold slope. The units are V/decade (dec), where a decade corresponds to a tenfold increase in the drain current Id.

Vth_on is the highest the Vth of an SGD transistor can be in order for the SGD transistor to be strongly conductive when Vsgd is applied. Vth_off is the lowest the Vth of an SGD transistor can be in order for the SGD transistor to be strongly non-conductive when Vsgd is applied. Vth_on>Vth_off. Thus, during a programming operation for memory cells, when Vsgd exceeds Vth_on, the SGD transistors for the selected NAND strings are made conductive so that the Vth of the selected memory calls can be increased. When Vsgd is lower than Vth_off, the SGD transistors for the unselected NAND strings are made non-conductive. In this case, the leakage through the SGD transistor becomes low so that channel boosting can occur.

Assuming Vdd is applied to the bit line, at the drain of an SGD transistor, Vsgd should satisfy: Vth_on<Vsgd<Vdd+Vth_off. This considers only one NAND string. We can define the Vsgd window or margin as: Vsgd window=Vdd–(Vth_on–Vth_off). However, a programming operation involves a set of NAND strings which will have SGD transistors with varying threshold voltages. When considering the variation in the threshold voltages, the Vsgd window is further reduced to: Vsgd window=Vdd−(Vth_on−Vth_off)−(Vth_high−Vth_low), where Vth_high is the highest Vth among the SGD transistors and Vth_low is the lowest Vth among the Vsgd transistors. This example assumes QPW programming is not used. For QPW programming, the window is reduced further by the amount by which Vbl is increased in the QPW mode, Vbl_qpw (e.g., 0.5-1 V). The value of Vth_on−Vth_off should be as small as possible to allow the Vsgd window to be as large as possible.

As a specific example, for a selected NAND string, the drain end of the string is connected to a bit line voltage Vbl_sel which is grounded (0 V) or set to Vbl_qpw. Vsgd should be sufficiently high to make the SGD transistor strongly conductive. Vsgd should therefore exceed Vth+Vbl_sel+delta. With delta=0.5 V and Vbl=0 V, Vsgd>Vth+0.5 V. Furthermore, for an unselected NAND string, the drain end of the string is connected to Vbl_unsel=Vdd, e.g., 3 V. Vsgd should be sufficiently low to make the SGD transistor strongly non-conductive. Vsgd should therefore be less than Vth+Vbl_unsel−delta. For example, Vsgd<Vth+2.5 V. With an example Vth of 2 V, we have 2.5 V<Vsgd<4.5 V.

FIG. 12A indicates that Vth_on−Vth_off can be lowered if subthreshold slope is lowered.

Figure 12B:
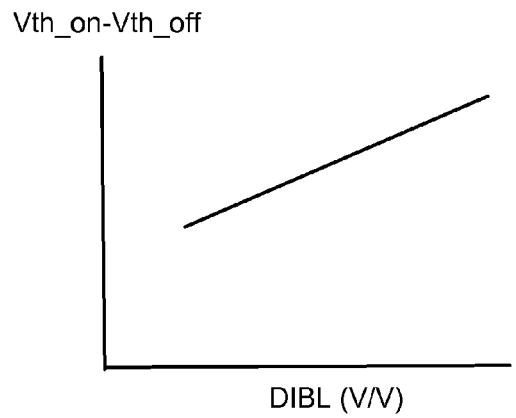
FIG. 12B depicts a plot of Vth_on–Vth_off versus drain-induced barrier lowering (DIBL), for an SGD transistor.

FIG. 12B depicts a plot of Vth_on−Vth_off versus drain-induced barrier lowering (DIBL), for an SGD transistor. The Vsgd window is reduced by a decrease in the Vth of an SGD transistor which is caused by DIBL. DIBL is a short channel effect of a transistor in which the Vth decreases as the drain voltage increases. The units are Volts of decrease of Vth per Volts of increase in Vd. The DIBL effect for the SGD transistor of an unselected NAND string is greater than the DIBL effect for the SGD transistor of a selected NAND string since Vbl_unsel>Vbl_sel. Further, the DIBL effect is more problematic for an unselected NAND string because it lowers Vth_off, thereby widening the Vsgd window. The plot indicates that Vth_on−Vth_off can be lowered if DIBL if lowered.

Figure 12C:
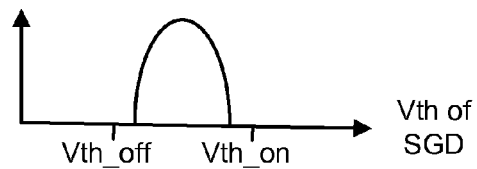
FIG. 12C depicts a Vth distribution of a set of SGD transistors.

FIG. 12C depicts a Vth distribution of a set of SGD transistors. As mentioned, the Vth of different SGD transistors typically has a distribution about a median value. Here, the Vth distribution ranges between Vth_off and Vth_on, so that all SGD transistors will operate properly in a programming operation.

Figure 12D:
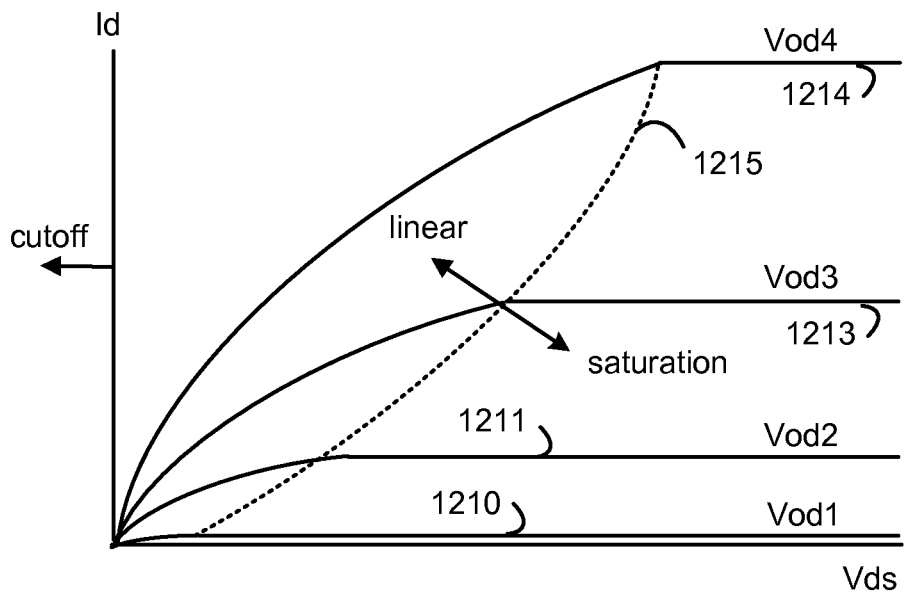
FIG. 12D depicts a plot of drain current (Id) versus drain-to-source voltage (Vds) for an SGD transistor.

FIG. 12D depicts a plot of drain current (Id) versus drain-to-source voltage (Vds) for an SGD transistor. Lines 1210-1214 represent increasing levels of a control gate overdrive voltage (Vod), where Vod4>Vod3>Vod2>Vod1. Recall that Vod=Vgs−Vth=(Vg−Vs)−Vth. A dashed line 1215 represents a boundary between a linear operating mode of the transistor and a saturation mode. In the linear mode, current increases in a channel in proportion to Vds for a fixed Vod. In the saturation mode, the current is fixed even as Vds increases, with a fixed Vod. In a cutoff mode, current does not flow.

Figure 12E:
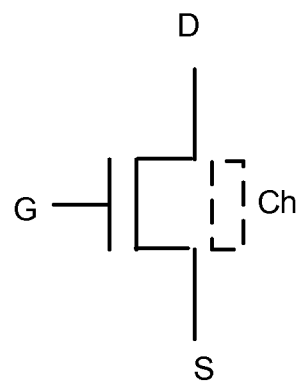
FIG. 12E depicts an example of an SGD transistor.

FIG. 12E depicts an example of an SGD transistor. The transistor includes a gate G having a voltage Vg (or Vsgd), a drain D having a voltage Vd, a source S having a voltage Vs, and a channel Ch having a voltage Vch.

Accordingly, it can be seen that one embodiment provides a 3D stacked non-volatile memory device (100) comprising: alternating dielectric layers (DL0-DL25) and conductive layers (WLL0-WLL23, SGLdwf, SGL1, SG2, SGL3, SGLdwfa) in a stack (231, 376); a set (267, 377) of NAND strings (NS0-1, ..., NS0-14, NS1-NS5; NS0A, ..., NS0A-14, NS1A-NS5A, NS_sel, NS_unsel; NS_selA, NS_unselA) formed in the stack, the set of NAND strings comprising one NAND string (NS_unsel, NS_unselA) and another NAND string (NS_sel, NS_selA), the one NAND string comprising a source-end select gate transistor (SGS_unsel, SGS_unselA), a plurality of memory cells (MC_unsel, MC_unselA), a first drain-end select gate transistor (SGD1_unsel, SGD1_unselA) and a second drain-end select gate transistor (SGD2_unsel, SGD2_unselA) between the plurality of memory cells and the first drain-end select gate transistor, the another NAND string comprising a source-end select gate transistor (SGS_sel, SGS_selA), a plurality of memory cells (MC_sel, MC_selA), a first drain-end select gate transistor (SGD1_sel, SGD1_selA) and a second drain-end select gate transistor (SGD2_sel, SGD2_selA) between the a plurality of memory cells of the another NAND string and the first drain-end select gate transistor of the another NAND string, control gates (CG1_sel, CG1_unsel, CG1_selA, CG1_unselA) of the first drain-end select gate transistors are connected to one another by one of the conductive layers (SGL1), and control gates (CG2_sel, CG2_unsel, CG2_selA, CG2_unselA) of the second drain-end select gate transistors are connected to one another by another of the conductive layers (SGL2).

Also provided is a control circuit (110, 112, 114, 116, 122, 128, 130, 132) in communication with the stack. The control circuit applies a program pulse (1101-1105) to a selected memory cell (MC_sel; MC_selA) of the another NAND string and, during the program pulse: to allow programming of the selected memory cell, provides the first and second drain-end select gate transistors of the another NAND string in a conductive state, and to inhibit programming in the one NAND string, provides the first and second drain-end select gate transistors of the one NAND string in a non-conductive state, while providing a control gate overdrive voltage of the first drain-end select gate transistors which is lower than a control gate overdrive voltage of the second drain-end select gate transistors.

In another embodiment, a method is provided for programming in a 3D stacked non-volatile memory device (100) comprising alternating dielectric layers (DL0-DL25) and conductive layers (WLL0-WLL23, SGLdwf, SGL1, SG2, SGL3, SGLdwfa) in a stack (231, 376), The method comprises: allowing programming in a selected NAND string (NS_sel, NS_selA); and inhibiting programming in an unselected NAND string (NS_unsel, NS_unselA) during the allowing programming in the selected NAND string, the unselected NAND string comprising a source-end select gate transistor (SGS_sel, SGS_selA), a plurality of memory cells (MC_sel, MC_selA), a first drain-end select gate transistor (SGD1_sel, SGD1_selA) and a second drain-end select gate transistor (SGD2_sel, SGD2_selA) between the plurality of memory cells and the first drain-end select gate transistor, the selected NAND string comprising a source-end select gate transistor (SGS_unsel, SGS_unselA), a plurality of memory cells (MC_sel, MC_selA), a first drain-end select gate transistor (SGD1_sel, SGD1_selA) and a second drain-end select gate transistor (SGD2_sel, SGD2_selA) between the plurality of memory cells of the selected NAND string and the first drain-end select gate transistor of the selected NAND string, control gates (CG1_sel, CG1_unsel) of the first drain-end select gate transistors are connected to one another by one of the conductive layers (SGL1), and control gates (CG2_sel, CG2_unsel) of the second drain-end select gate transistors are connected to one another by another of the conductive layers (SGL2), the inhibiting programming comprising providing the first and second drain-end select gate transistors of the unselected NAND string in a non-conductive state while providing a control gate overdrive voltage of the first drain-end select gate transistors which is lower than a control gate overdrive voltage of the second drain-end select gate transistors.

In another embodiment, a 3D stacked non-volatile memory device (100) comprises: alternating dielectric layers (DL0-DL25) and conductive layers (WLL0-WLL23, SGLdwf, SGL1, SG2, SGL3, SGLdwfa) in a stack (231, 376); an unselected NAND string (NS_unsel, NS_unselA) extending in the stack, the unselected NAND string is connected to a bit line (BL0, BL0A) and comprises first and second drain-end select gate transistors (SGD1_sel, SGD1_selA, 274*d*; SGD2_unsel, SGD2_unselA, 278*d*) and a plurality of memory cells (MC_unsel, MC_unselA, MC), the first and second drain-end select gate transistors are between the bit line and the plurality of memory cells, the second drain-end select gate transistor is between the first drain-end select gate transistor and the plurality of memory cells, and the unselected NAND string comprises a channel (405) which extends vertically in the stack; and a control circuit (110, 112, 114, 116, 122, 128, 130, 132) in communication with the stack. The control circuit, to inhibit programming in the unselected NAND string during programming of a selected NAND string: controls the first and second drain-end select gate transistors to provide the first and second drain-end select gate transistors in a non-conductive state and provide a discontinuous potential in the channel between the first and second drain-end select gate transistors, a portion (421) of the channel directly adjacent to the first drain-end select gate transistor (274*d*) has a lower potential than a portion (423) of the channel directly adjacent to the second drain-end select gate transistor.

In another embodiment, a 3D stacked non-volatile memory device (100) comprises: alternating dielectric layers (DL0-DL25) and conductive layers (WLL0-WLL23, SGLdwf, SGL1, SG2, SGL3, SGLdwfa) in a stack (231, 376); and a NAND string (NS0-1, ..., NS0-14, NS1-NS5; NS0A, ..., NS0A-14, NS1A-NS5A, NS_sel, NS_unsel; NS_selA, NS_unselA) formed in the stack. The NAND string comprises a source-end select gate transistor (SGS_unsel, SGS_unselA; 268*s*, 269*s*, 270*s*, 271*s*; 274*s*, 275*s*, 276*s*, 277*s*) at a source end (SE) of the NAND string, one or more drain-end select gate transistors (SGD1_unsel, SGD1_unselA, SGD2_unsel, SGD2_unselA, SGD3_unsel, SGD3_unselA; 268*d*, 269*d*, 270*d*, 271*d*; 274*d*, 275*d*, 276*d*, 277*d*) at a drain end (DE) of the NAND string and a plurality of memory cells (MC; MC_sel, MC_selA; MC_unsel, MC_unselA) between the source-end select gate transistor and the one or more drain-end select gate transistors, the one or more drain-end select gate transistors comprise a first control gate material (235, SGL1, 272, CG1_sel, CG1_unsel, CG1_selA, CG1_unselA, 412, 420) which has a relatively higher work function and a second control gate material (235, SGL2, 273, CG2_sel, CG2_unsel, CG2_selA, CG2_unselA, 413, 422) which has a relatively lower work function, and the first control gate material is before the second control gate material relative to the drain end.

In another embodiment, a 3D stacked non-volatile memory device (100) comprises: alternating dielectric layers (DL0-DL25) and conductive layers (WLL0-WLL23, SGLdwf, SGL1, SG2, SGL3, SGLdwfa) in a stack (231, 376); and a NAND string (NS0-1, ..., NS0-14, NS1-NS5; NS0A, ..., NS0A-14, NS1A-NS5A, NS_sel, NS_unsel; NS_selA, NS_unselA) formed in the stack. The NAND string comprises a source-end select gate transistor (SGS_unsel, SGS_unselA; 268*s*, 269*s*, 270*s*, 271*s*; 274*s*, 275*s*, 276*s*, 277*s*) at a source end (SE) of the NAND string, a first drain-end select gate transistor (SGD1_unsel, SGD1_unselA, SGD2_unsel, SGD2_unselA, SGD3_unsel, SGD3_unselA; 268*d*, 269*d*, 270*d*, 271*d*; 274*d*, 275*d*, 276*d*, 277*d*) at a drain end (DE) of the NAND string, a plurality of memory cells (MC; MC_sel, MC_selA; MC_unsel, MC_unselA) between the source-end select gate transistor and the first drain-end select gate transistor, and a second drain-end select gate transistor (278*d*, 279*d*, 280*d* and 281*d*) between the plurality of memory cells and the first drain-end select gate transistor, the first drain-end select gate transistor comprising a control gate material (235, SGL1, 272, CG1_sel, CG1_unsel, CG1_selA, CG1_unselA, 412, 420) having a work function which is higher than a work function of a control gate material (235, SGL2, 273, CG2_sel, CG2_unsel, CG2_selA, CG2_unselA, 413, 422) of the second drain-end select gate transistor.

In another embodiment, a 3D stacked non-volatile memory device comprises: alternating dielectric layers and conductive layers in a stack; and a NAND string formed in the stack. The NAND string comprises a source-end select gate transistor at a source end of the NAND string, a drain-end select gate transistor at a drain end of the NAND string, the drain-end select gate transistor comprising a multi-work function gate, and a plurality of memory cells between the between the source-end select gate transistor and the drain-end select gate transistor, the drain-end select gate transistor comprising a first control gate material which has a relatively higher work function and a second control gate material which has a relatively lower work function, the first control gate material is before the second control gate material relative to the drain end.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A 3D stacked non-volatile memory device, comprising:
   alternating dielectric layers and conductive layers in a stack;
   a set of NAND strings formed in the stack, the set of NAND strings comprising one NAND string and another NAND string, the one NAND string comprising a source-end select gate transistor, a plurality of memory cells, a first drain-end select gate transistor and a second drain-end select gate transistor between the plurality of memory cells and the first drain-end select gate transistor, the another NAND string comprising a source-end select gate transistor, a plurality of memory cells, a first drain-end select gate transistor and a second drain-end select gate transistor between the a plurality of memory cells of the another NAND string and the first drain-end select gate transistor of the another NAND string, control gates of the first drain-end select gate transistors are connected to one another by one of the conductive layers, and control gates of the second drain-end select gate transistors are connected to one another by another of the conductive layers; and
   a control circuit in communication with the stack, the control circuit is configured to apply a program pulse to a selected memory cell of the another NAND string and, during the program pulse: to allow programming of the selected memory cell, provide the first and second drain-end select gate transistors of the another NAND string in a conductive state, and to inhibit programming in the one NAND string, provide the first and second drain-end select gate transistors of the one NAND string in a non-conductive state, while providing a control gate overdrive voltage of the first drain-end select gate transistors which is lower than a control gate overdrive voltage of the second drain-end select gate transistors, wherein for each select gate transistor of the first drain-end select gate transistors and the second drain-end select gate transistors, the control gate overdrive voltage is equal to Vgs–Vth, where Vgs is a control gate voltage minus a source voltage and Vth is a threshold voltage.

2. The 3D stacked non-volatile memory device of claim 1, wherein:
the one NAND string comprises a channel; and
a discontinuous potential in the channel, between the first and second drain-end select gate transistors of the one NAND string, is formed due to the control gate overdrive voltage of the first drain-end select gate transistor of the one NAND string being lower than the control gate overdrive voltage of the second drain-end select gate transistor of the one NAND string, the channel potential is lower under the first drain-end select gate transistor of the one NAND string than under the second drain-end select gate transistor of the one NAND string.

3. The 3D stacked non-volatile memory device of claim 1, wherein:
the first drain-end select gate transistors have a lower control gate overdrive voltage than the second drain-end select gate transistors due to the control circuit providing, during the program pulse, a voltage on the control gates of the first drain-end select gate transistors which is lower than a voltage on the control gates of the second drain-end select gate transistors.

4. The 3D stacked non-volatile memory device of claim 3, wherein:
the threshold voltages of the first drain-end select gate transistors are equal to the threshold voltage of the second drain-end select gate transistors.

5. The 3D stacked non-volatile memory device of claim 1, wherein:
the first drain-end select gate transistors have a lower control gate overdrive voltage than the second drain-end select gate transistors due to the threshold voltage of the first drain-end select gate transistors being higher than the threshold voltage of the second drain-end select gate transistor.

6. The 3D stacked non-volatile memory device of claim 5, wherein:
the control circuit, during the program pulse, is configured to provide an equal voltage on the control gates of the first and second drain-end select gate transistors.

7. The 3D stacked non-volatile memory device of claim 6, wherein:
the control gates of the first drain-end select gate transistors are connected to the control gates of the second drain-end select gate transistors.

8. The 3D stacked non-volatile memory device of claim 1, wherein:
the one NAND string comprises a third drain-end select gate transistor, the third drain-end select gate transistor of the one NAND string is between the plurality of memory cells of the one NAND string and the second drain-end select gate transistor of the one NAND string; and during the program pulse, the control circuit is configured to provide the third select gate transistor with a control gate overdrive voltage equal to or greater than the control gate overdrive voltage of the second drain-end select gate transistors.

9. The 3D stacked non-volatile memory device of claim 1, wherein:
the first and second drain-end select gate transistors have a common control gate length.

10. A method for programming in a 3D stacked non-volatile memory device comprising alternating dielectric layers and conductive layers in a stack, the method comprising:
allowing programming in a selected NAND string; and
inhibiting programming in an unselected NAND string during the allowing programming in the selected NAND string, wherein:
the unselected NAND string comprises a source-end select gate transistor, a plurality of memory cells, a first drain-end select gate transistor and a second drain-end select gate transistor between the plurality of memory cells and the first drain-end select gate transistor,
the selected NAND string comprises a source-end select gate transistor, a plurality of memory cells, a first drain-end select gate transistor and a second drain-end select gate transistor between the plurality of memory cells of the selected NAND string and the first drain-end select gate transistor of the selected NAND string,
control gates of the first drain-end select gate transistors are connected to one another by one of the conductive layers,
control gates of the second drain-end select gate transistors are connected to one another by another of the conductive layers,
the inhibiting programming comprises providing the first and second drain-end select gate transistors of the unselected NAND string in a non-conductive state while providing a control gate overdrive voltage of the first drain-end select gate transistors which is lower than a control gate overdrive voltage of the second drain-end select gate transistors, and
a threshold voltage of the first drain-end select gate transistors is higher than a threshold voltage of the second drain-end select gate transistors.

11. The method of claim 10, wherein:
the control gate overdrive voltage of the first drain-end select gate transistors is lower than the control gate overdrive voltage of the second drain-end select gate transistors by at least 0.5 V.

12. The method of claim 10, wherein:
the providing the control gate overdrive voltage of the first drain-end select gate transistors which is higher than the control gate overdrive voltage of the second drain-end select gate transistors, comprises providing a voltage on the control gates of the first drain-end select gate transistors which is equal to a voltage on the control gates of the second drain-end select gate transistors.

13. The method of claim 12, wherein:
the threshold voltages of the first and second drain-end select gate transistors are set by a programming process which occurs before the programming in the selected NAND string.

14. A 3D stacked non-volatile memory device, comprising:
alternating dielectric layers and conductive layers in a stack;

an unselected NAND string extending in the stack, the unselected NAND string is connected to a bit line and comprises first and second drain-end select gate transistors and a plurality of memory cells, the first and second drain-end select gate transistors are between the bit line and the plurality of memory cells, a threshold voltage of the first drain-end select gate transistor is higher than a threshold voltage of the second drain-end select gate transistor, the second drain-end select gate transistor is between the first drain-end select gate transistor and the plurality of memory cells, and the unselected NAND string comprises a channel which extends vertically in the stack; and a control circuit in communication with the stack, the control circuit, to inhibit programming in the unselected NAND string during programming of a selected NAND string is configured to: control the first and second drain-end select gate transistors to provide the first and second drain-end select gate transistors in a non-conductive state and provide a discontinuous potential in the channel between the first and second drain-end select gate transistors, wherein a portion of the channel directly adjacent to the first drain-end select gate transistor has a lower potential than a portion of the channel directly adjacent to the second drain-end select gate transistor.

15. The 3D stacked non-volatile memory device of claim 14, wherein:

the control circuit, to provide the discontinuous potential in the channel between the first and second drain-end select gate transistors, is configured to provide a control gate overdrive voltage of the first drain-end select gate transistor which is lower than a control gate overdrive voltage of the second drain-end select gate transistor.

16. The 3D stacked non-volatile memory device of claim 15, wherein:

the control gate overdrive voltage of the first drain-end select gate transistor is lower than the control gate overdrive voltage of the second drain-end select gate transistor by at least 0.5 V.

17. The 3D stacked non-volatile memory device of claim 14, wherein:

the control circuit, to provide the discontinuous potential in the channel between the first and second drain-end select gate transistors, is configured to provide a voltage on a control gate of the first drain-end select gate transistor which is lower than a voltage on a control gate of the second drain-end select gate transistor.

18. The 3D stacked non-volatile memory device of claim 14, wherein:

the control circuit, to provide the discontinuous potential in the channel between the first and second drain-end select gate transistors, is configured to provide a voltage on a control gate of the first drain-end select gate transistor which is equal to a voltage on a control gate of the second drain-end select gate transistor.

* * * * *